United States Patent [19]

Yamamoto et al.

[11] Patent Number: 5,675,600
[45] Date of Patent: Oct. 7, 1997

[54] LASER DIODE DRIVER SYSTEM

[75] Inventors: Satoshi Yamamoto; Tetsuya Fukaya, both of Yokohama; Shuhei Kawauchi, Sapporo; Masahiko Yamashita, Kawasaki, all of Japan

[73] Assignee: Fujitsu Limited, Kawasaki, Japan

[21] Appl. No.: 661,829

[22] Filed: Jun. 11, 1996

[30] Foreign Application Priority Data

Sep. 27, 1995 [JP] Japan .................. 7-249968

[51] Int. Cl.⁶ .................................................. H01S 3/00
[52] U.S. Cl. ........................................................ 372/38
[58] Field of Search ................................ 372/38, 33, 29

[56] References Cited

U.S. PATENT DOCUMENTS

| | | | |
|---|---|---|---|
| 5,349,595 | 9/1994 | Ogawa et al. | 372/38 |
| 5,377,213 | 12/1994 | Honda | 372/29 |
| 5,513,197 | 4/1996 | Koishi | 372/38 |
| 5,563,989 | 10/1996 | Ikeuchi et al. | 372/29 |

FOREIGN PATENT DOCUMENTS

| | | |
|---|---|---|
| 54-90982 | 7/1979 | Japan . |
| 4-115583 | 4/1992 | Japan . |
| 4-175679 | 6/1992 | Japan . |
| 6-164049 | 6/1994 | Japan . |

Primary Examiner—Leon Scott, Jr.
Attorney, Agent, or Firm—Staas & Halsey

[57] ABSTRACT

A laser diode driver solves problems of APC (Auto Power Control) group, a LD monitor group, and an optical output waveform, which occur when reducing adjusting resistors constituted in a conventional laser diode drive. The laser diode driver includes a laser diode for emitting a light output corresponding to an input signal, a light-receipt element for receiving a part of the light output emitted from the laser diode and outputting a light-receipt signal current corresponding to the received part of the light output, a driver circuit operatively coupled to the laser diode for supplying a driving current, which drives the laser diode to emit the light output, a duty variable controller for varying duty of a waveform of the driving current, an optical output stabilization loop for detecting a peak value corresponding to the light-receipt current outputted from the light-receipt element, comparing the detected peak value with a first reference value, and controlling the driver circuit to output a size of the driving current according to the difference between the detected peak value and the first reference value, and a duty stabilization loop for detecting an average value corresponding to the light-receipt signal current outputted from the light-receipt element, comparing the detected average with a second reference value, and controlling the duty variable controller to output the duty of the waveform of the driving current according to the difference between the detected average value and the second reference value.

21 Claims, 33 Drawing Sheets

FIG. 35A  FIG. 35B
PRIOR ART
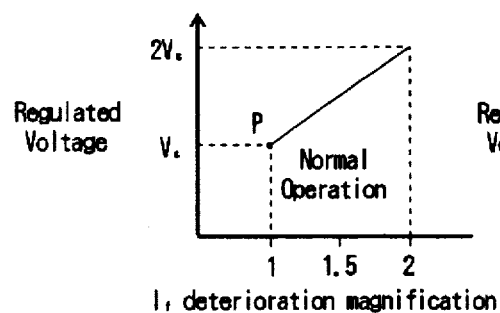 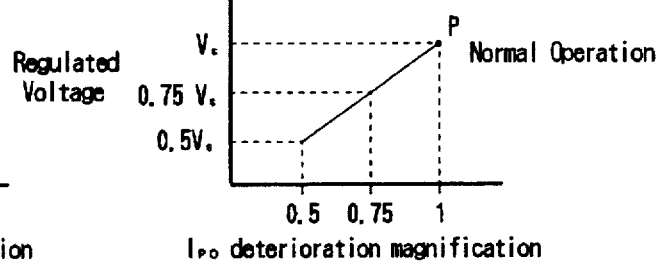
FIG. 36
PRIOR ART
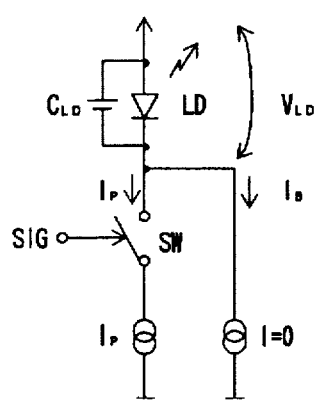

LASER DIODE DRIVER SYSTEM

BACKGROUND OF THE INVENTION

1. Field of the Invention

The present invention relates to a laser diode driver system, and more particularly to a laser diode driver system having an electrical circuit in an optical modulator, which modulates an electric signal to an optical signal with the use of a laser diode (hereinafter, it is called as a LD).

2. Description of the Related Art

A laser diode for converting an electric signal to an optical signal, has characteristic parameters, such as a threshold current Ith, a differential efficiency N, an optical output delay $t_d$, a bias optical output Pth or the like, each of which has a temperature characteristic and dispersion per a chip.

FIG. 28 explains a fluctuation of a current control characteristic on each temperature. In FIG. 28, I to III show a LD current control characteristic showing a relationship between driver current I and an optical output P of the laser diode at temperature 0° C., 25° C. or 60° C., respectively.

As shown in FIG. 28, the threshold current Ith changes to Ith0, Ith25, and Ith60 corresponding to the temperature 0° C., 25° C., and 60° C. Then, the differential efficiency $\eta$, which appears as a slope of characteristic, changes to $\eta_0, \eta_{25}$ or $\eta_{60}$.

Accordingly, it is controlled that the bias current $I_B$ for giving current bias until coming to the threshold value becomes $I_{B0}, I_{B25}$ or $I_{B60}$, respectively in correspondence with the temperature 0° C., 25° C. and 60° C., and further, the signal driver current $I_P$ becomes $I_{P0}, I_{P25}$ or $I_{P60}$, respectively in correspondence with the temperature 0° C., 25° C. and 60° C., in order to output constant optical output $P_0$.

As explained above, the temperature characteristic is different per a chip of the LD. FIG. 29 shows a difference of characteristics between each bias current $I_B$ of the LD at each temperature and signal driver current $I_P$. In FIG. 29, characteristics of I, II, and III can be obtained by plotting the bias current $I_B$ required for obtaining predetermined optical output and points corresponding to signal driver currents $I_P$ at the temperature of 0° C., 25° C. or 60° C., and tying the points. It is apparent from FIG. 29 that characteristics of LD corresponding to I, II, or III be dispersed.

The above-described fluctuations cause changing the optical output power and deteriorating waveforms as the result. Therefore, a method for suppressing to change the optical output power, and adjusting constant values of a circuit per a chip of the laser diode with the use of a negative feed-back circuit has been employed in the conventional driver.

FIG. 30 shows an example of a conventional laser diode driver system employing the above-described negative feed-back circuit. In FIG. 30, a bias current $I_B$, which is a direct current, is supplied from a bias current source $SI_B$ to a laser diode LD. Then, a signal driver current source $SI_P$ is connected through a switch SW to the LD.

The switch SW is switched according to signal data DATA. Therefore, the signal driver current $I_P$ corresponding to the signal data DATA is supplied to the LD with the bias current $I_B$. Therefore, an optical signal, which is proportioned to a size exceeding the threshold value Ith of the LD driver current, can be outputted from the LD.

A light-receipt element PD, such as a photo diode, receives a part of an optical signal outputted from the LD to convert to an electrical current. A comparison amplifier AMP compares the voltage value, which is generated by that the electrical current converted in the light-receipt element PD with a reference potential Vref. The signal outputted from the comparison amplifier AMP is fed-back and inputted to a driver controller CONT.

The driving controller CONT controls the size of the bias current $I_B$ and the signal driver current $I_P$ by controlling the bias current source $SI_B$ and the signal driver current source $SI_P$ according to the fed-back output signal outputted from the comparison amplifier AMP to obtain constant optical output.

Further, resistors R2 and R3 are adjusted by dividing the driver current for the LD into the bias current $I_B$ and the signal driver current $I_P$ to suppress fluctuation of optical output power for the constant optical output and correspond to the dispersion per a chip of the laser diode. Conversion efficiency $\eta$ can be adjusted by adjusting the resistor R1.

Returning back to FIG. 29, a relationship between $I_P$ and $I_B$ of each chip becomes $I_P = \alpha I_B + \beta$. Therefore, the alpha and beta can be obtained per each chip by adjusting the above-described resistors R2 and R3.

FIG. 31 shows a current control characteristic of a LD for further consideration of parameters. In FIG. 31, A means the I-P characteristic, B means a driving signal pulse, and C means an optical output pulse.

As compared the driving signal pulse B with the optical output pulse C, which has a delay time of $t_d$ on leading time, and the pulse width of the optical output pulse C becomes smaller than that of the driver signal pulse B. The delay time $t_d$, which is expressed on an equation (1), is called as an optical output delay. Mainly, the delay time is considered as caused by carrier movements in the LD.

$$td = \tau s \cdot \ln \frac{If - IB}{If - Ith} \qquad (1)$$

$\tau s$: life time of carrier

Further, if the current is less than the threshold current Ith, a slope of the I-P characteristic of the LD is not zero, and a minute optical output, i.e., a bias optical output $P_B$, proportioned to the bias current $I_B$ is generated. A ratio $(P_0/P_b)$ between the bias optical output $P_B$ and a full optical output $P_0$ generated from the driving signal pulse B is called as an extinction ratio.

FIG. 32 shows a structural diagram of the conventional laser diode driver system formed as considering the various kinds of the above-described parameters. In FIG. 32, a signal data DATA and a clock CLK are inputted to an interface circuit 1. For example, the interface circuit 1 synchronizes a parallel signal data DATA with a clock CLK to convert to a serial data signal.

A flip flop circuit 2 shapes the waveform of the output from the interface circuit 1 and leads it a duty controller 3. The duty controller 3 adjusts a pulse width of a driving signal, which is an electrical signal, to regulate an optical output duty variation, which is caused by dispersions of the circuit and LD optical output delay by the use of adjusting resistor RVO, which is provided in the duty controller 3.

The output from the duty controller 3 is inputted to a driver 4. The driver 4 including a switch, of which switching operation is controlled according to the inputted signal, controls supplement of the signal driver current $I_P$ based on the input signal data for the laser diode LD.

Further, a part of the signal driver current $I_P$ is outputted as a monitor current $I_{Pm}$ from the driver circuit 4. Meanwhile, a controller 5 including a current source for the signal driver current $I_P$ and the bias current $I_B$ adjusts coefficients α and β on a relationship between $I_P=\alpha I_B+\beta$ of the laser diode LD per a chip of the LD with the use of adjusting resistors RV2 and RV3.

Further, the controller 5 outputs a part of the bias current $I_B$ as a monitor current $I_{Bm}$.

A photo diode is generally employed as a light-receipt element PD for receiving a part of an optical output of the laser diode LD and converting it to an electrical signal. The adjusting resistor RV1 adjusts a level of the converted light-receipt electrical signal. Therefore, the dispersion of an optical group or optical system between the LD and PD can be adjusted.

In FIG. 32, a LD monitor current regulator 6 receives a monitor current $I_{Pm}$ of a signal driver current $I_P$ and a monitor current $I_{Bm}$ of the bias current $I_B$ for the laser diode LD. Further, the composite value of the monitor currents $I_{Pm}$ and $I_{Bm}$ is used as a monitor current $I_{pm}$. The adjusting resistor RV4 is used to adjust the dispersion of the monitor current $I_{pm}$ due to the temperature variation so as to compensate a temperature characteristic.

Further, the adjusting resistor RV5 adjusts an absolute voltage stored as an initial value, which is used as a reference for adjusting to compensate the temperature characteristic. The adjusted monitor current is outputted as a LD monitor voltage $V_{ML}$.

A level of the voltage of $V_{PD}$, which is converted by the RV1 from the current output of the light-receipt element PD, is converted to output as a monitor voltage $V_{MP}$. The monitor voltages are measured and stored on initial value. Therefore, a level of deteriorating characteristics due to secular changes of the LD and PD can be predetermined, as compared with the measured values on initial value.

SUMMARY OF THE INVENTION

The conventional laser diode driver includes a plurality of regulating means or resistors as described above. Accordingly, it is an object of the present invention to provide a laser diode driver, in which a plurality of adjusting resistors required in the conventional driver may be removed.

Further, it is an another object of the present invention to provide a laser diode driver, which solves problems of an APC (Auto Power Control) group, a LD monitoring group and an optical output waveform when reducing the number of adjusting resistors.

A laser diode driver according to the present invention to realize the above-described objects has a basic structure as follows.

The laser diode driver includes a laser diode for emitting a light output corresponding to an input signal, a light-receipt element for receiving a part of the light output emitted from the laser diode and outputting a light-receipt signal current corresponding to the received part of the light output, a driver circuit operatively coupled to the laser diode for supplying a driving current, which drives the laser diode to emit the light output, a detecting circuit operatively coupled to the light-receipt element for detecting peak and average values of the light-receipt signal current outputted from the light-receipt element, and a feed back loop for feeding back a control signal to stable a level and a duty of the driving current.

Further, as a mode of configuration of the laser diode driver according to the present invention, the laser diode driver includes a laser diode for emitting a light output corresponding to an input signal, a light-receipt element for receiving a part of the light output emitted from the laser diode and outputting a light-receipt signal current corresponding to the received part of the light output, a driver circuit operatively coupled to the laser diode for supplying a driving current, which drives the laser diode to emit the light output, a duty variable controller for varying duty of a waveform of the driving current, an optical output stabilization loop for detecting a peak value corresponding to the light-receipt current outputted from the light-receipt element, comparing the detected peak value with a first reference value, and controlling the driver circuit to output a size of the driving current according to the difference between the detected peak value and the first reference value, and a duty stabilization loop for detecting an average value corresponding to the light-receipt signal current outputted from the light-receipt element, comparing the detected average with a second reference value, and controlling the duty variable controller to output the duty of the waveform of the driving current according to the difference between the detected average value and the second reference value.

Further, in order to solve the problem of fluctuation in a monitor voltage, the laser diode driver according to the present invention further includes a generator for generating a reference light-receipt signal current for the light-receipt element, corresponding to a predetermined output power of the laser diode, and an arithmetic circuit for receiving a light-receipt signal current outputted from the light-receipt element and the reference light-receipt signal current and converting the light-receipt signal current of the light-receipt element to a normalized monitor voltage, the arithmetic circuit including, a first current to voltage conversion circuit, a conversion gain of which is variably controlled, for converting the reference light-receipt signal current to a first corresponding voltage, a second current to voltage conversion circuit, a conversion gain of which is variably controlled, for converting the receipt-light signal current of the light-receipt element to a second corresponding voltage, a reference voltage, and a comparison amplifier for outputting a difference signal between the reference voltage outputted from the reference voltage generator for generating a reference voltage generator and the first corresponding voltage outputted from the first current to voltage conversion circuit, the difference signal being used for controlling the conversion gain of the second current to voltage conversion circuit.

Furthermore, in order to solve the problem of the pattern jitter, the laser diode driver according to the present invention is constituted so as to fix a voltage applied to the laser diode, when a driving current from the driver circuit is not supplied. More particularly, the laser diode driver includes a charge absorption circuit, of which one end is connected to a connecting point of the laser diode and the driver circuit for absorbing accumulated charges of the laser diode, when a driving current from the driver circuit to the laser diode is not supplied.

BRIEF DESCRIPTION OF THE DRAWINGS

FIGS. 35A and 35B explains problems on a LD monitor group.

FIG. 36 explains problems of optical output waveform.

DESCRIPTION OF THE PREFERRED EMBODIMENTS

Figure 1:
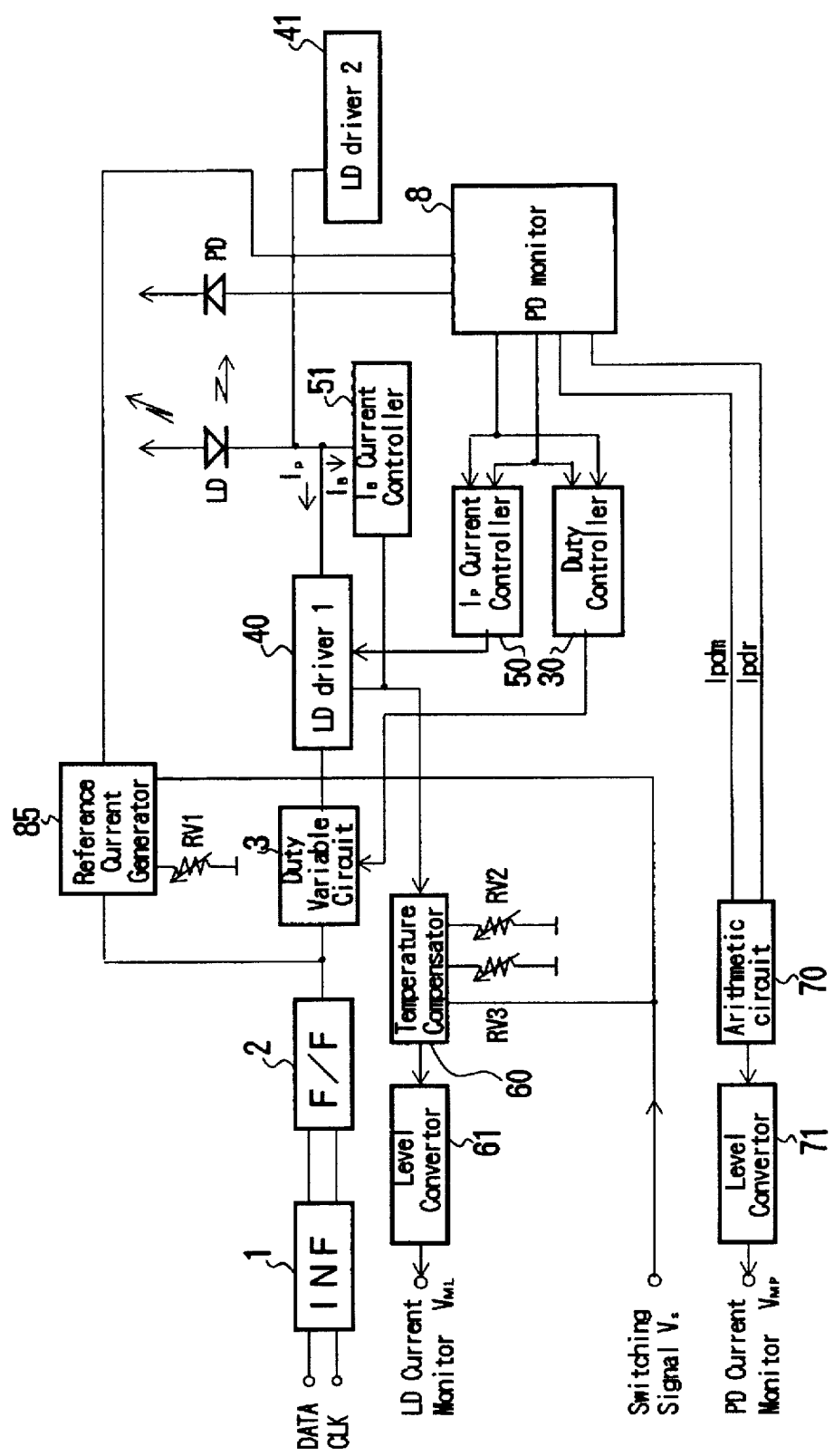
FIG. 1 is a block diagram showing an embodiment of the present invention.

Throughout the following description, the same reference numerals are used to denote and identify corresponding or identical components.

Before explanation of embodiments of the present invention, problems of an APC (Auto Power Control) group of the laser diode driver, a LD monitor group, and an optical output waveform, will be explained for better understanding of the present invention.

Figure 32:
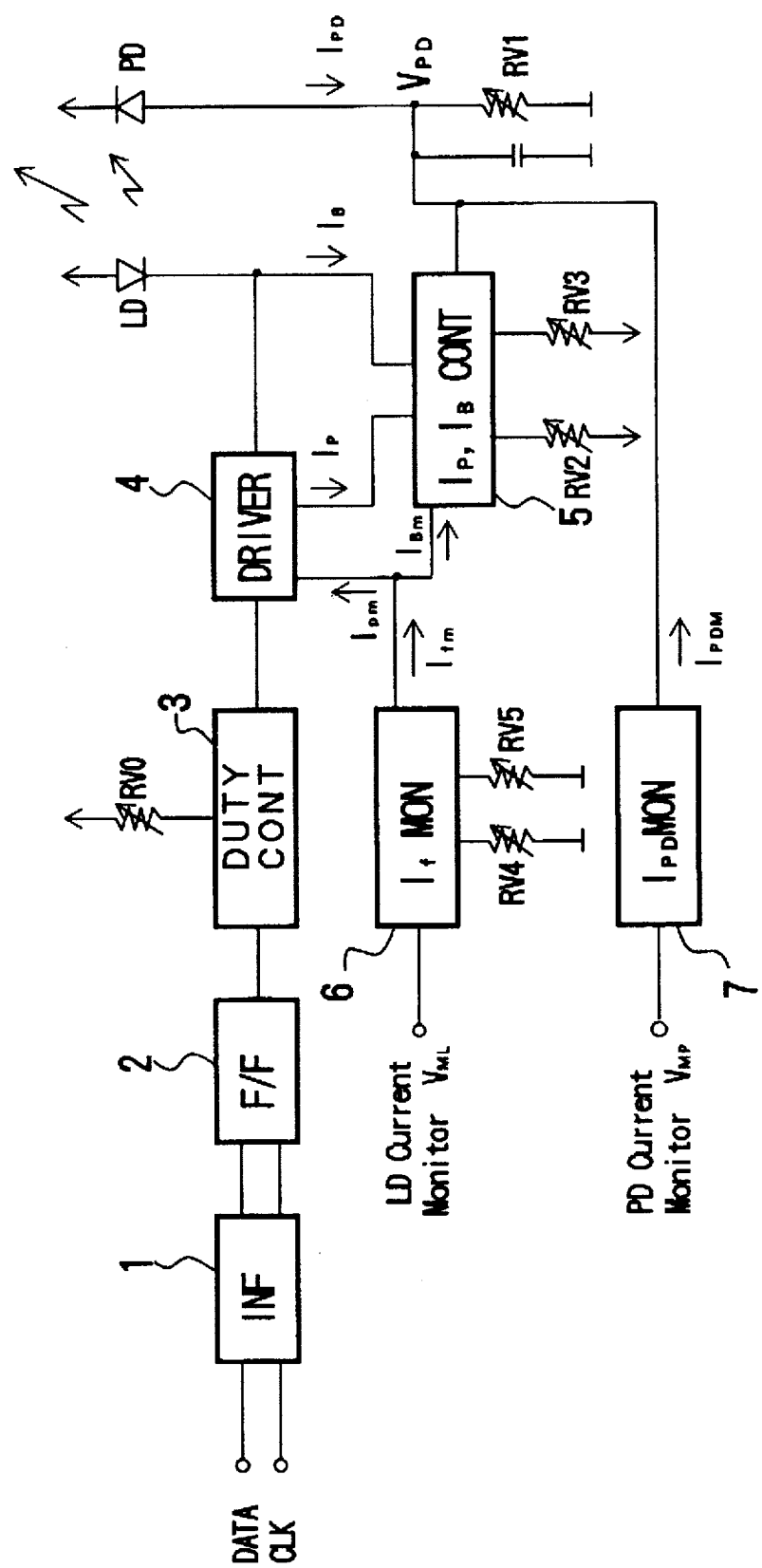
FIG. 32 shows a structural example of the conventional laser diode driver.
Figure 33:
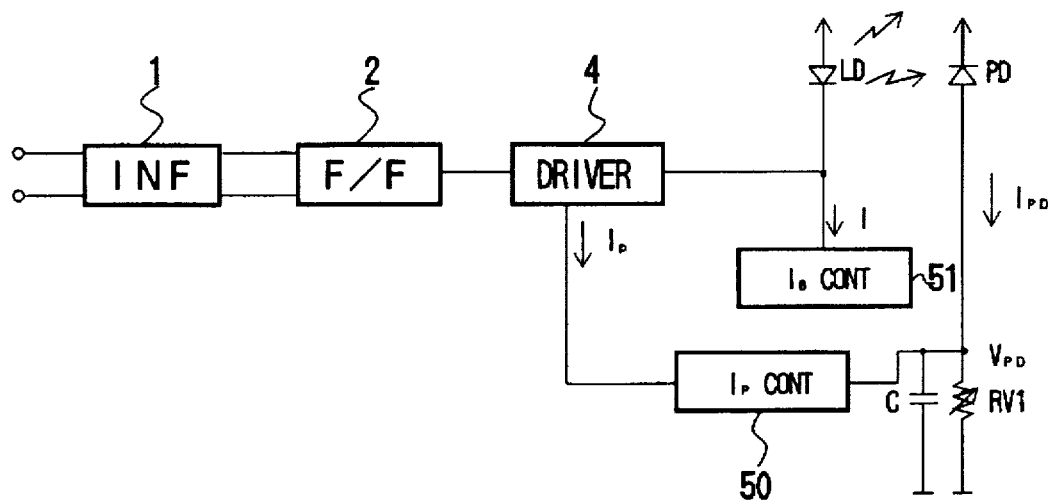
FIG. 33 shows a structural example of the conventional modified type laser diode driver.

FIG. 33 shows a structural example of the conventional modified type driver, in which adjusting resistors RV2 and RV3 of the $I_P$, $I_B$ controller 5 and the duty controller 3 are removed from the structure shown in FIG. 32, in order to extract only an APC group.

Figure 34:
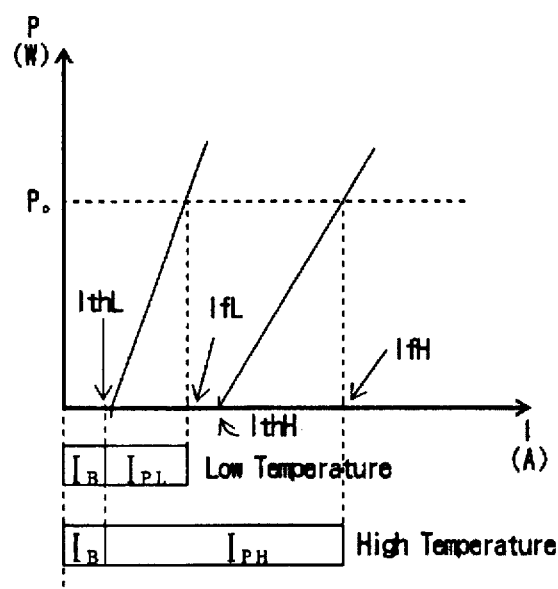
FIG. 34 explains problems on an APC group.

In this case, it is possible that the $I_P$ controller 50 can control the signal driver current $I_P$ in a form of a close loop for the laser diode LD. Meanwhile, the IB controller 51 can control the bias current $I_B$ in a form of an open loop. Therefore, as illustrating an I-P characteristic shown in FIG. 34, the bias current $I_B$ can be fixed as a low current or zero.

Accordingly, a problem of fluctuation of an optical output delay $t_d$, as described above, is generated. The values of on low-temperature and tdH on high-temperature are as shown in the equations (2) and (3).

$$tdL = \tau s \cdot \ln \frac{IfL - IB}{IfL - IthL} \quad (2)$$

$$tdH = \tau s \cdot \ln \frac{IfH - IB}{IfH - IthH} \quad (3)$$

If $I_B \approx IthL$, $tdl \approx \tau s \cdot \ln 1 = 0$ according to the above-described equation (2). Therefore, the maximum duty variable width due to temperature fluctuations will be as shown in an equation (4).

$$\Delta td = tdH - tdL = \tau s \cdot \ln \frac{IfH - IB}{IfH - IthH} \quad (4)$$

where $\Delta t_d$ becomes large, as the output power $P_o$ becomes small, $I_B$ becomes small, and further the usable temperature range becomes wide. Accordingly, when the signal frequency is high, the value of $\Delta t_d$ causes a problem. Further, on the time of regulating with an adjusting resistor RV1, a large variable width cannot be employed because of the problem on accuracy detection.

Returning back to FIG. 32, monitor circuits 6 and 7 monitor a LD current $I_f$ (=signal driver current $I_P$+bias current $I_B$) and a light-receipt current $I_{PD}$, respectively. FIG. 35A shows a graph illustrating a tendency of deterioration for a P point on normal operation of the LD current $I_f$ in the monitor circuit 6.

FIG. 35B shows a graph illustrating a tendency of deterioration for a P point on normal operation of the light-receipt current $I_{PD}$ in the monitor circuit 7.

Thus, in the structure shown in FIG. 32, the LD current $I_f$ and the light-receipt current $I_{PD}$ show independent tendencies of deterioration appeared the point P on normal operation. Accordingly, when a monitor adjustment is performed based on only a monitor output to simplify the adjustment, there would be influence of fluctuation on the other output.

It is apparent from the above-described problems that the monitor output voltage should be always kept the same voltage, even if the output power is changed on normal operation.

More particularly, the case where the commonly-structured driver can be used in a different condition will be considered. For example, it is noted that the output power should be different between the cases used within a local switch office and a terminal office, which is located over the long distance. In this case, as described above, it becomes necessary the monitor output voltage always output the same voltage, even if the output power is changed on normal operation.

However, as described above, when each section of the LD driver employed in the local switch office is adjusted according to the monitor output signal, it is difficult to use the commonly-structured driver in the terminal office, and separate adjustment are required.

Another problem as to optical output waveforms will be considered here. FIG. 36 illustrates the LD driver 4 for simplicity. If the switch SW is closed by the input signal SIG, the signal driver current $I_P$ is flowing in correspondence to the input signal SIG.

Figure 37:
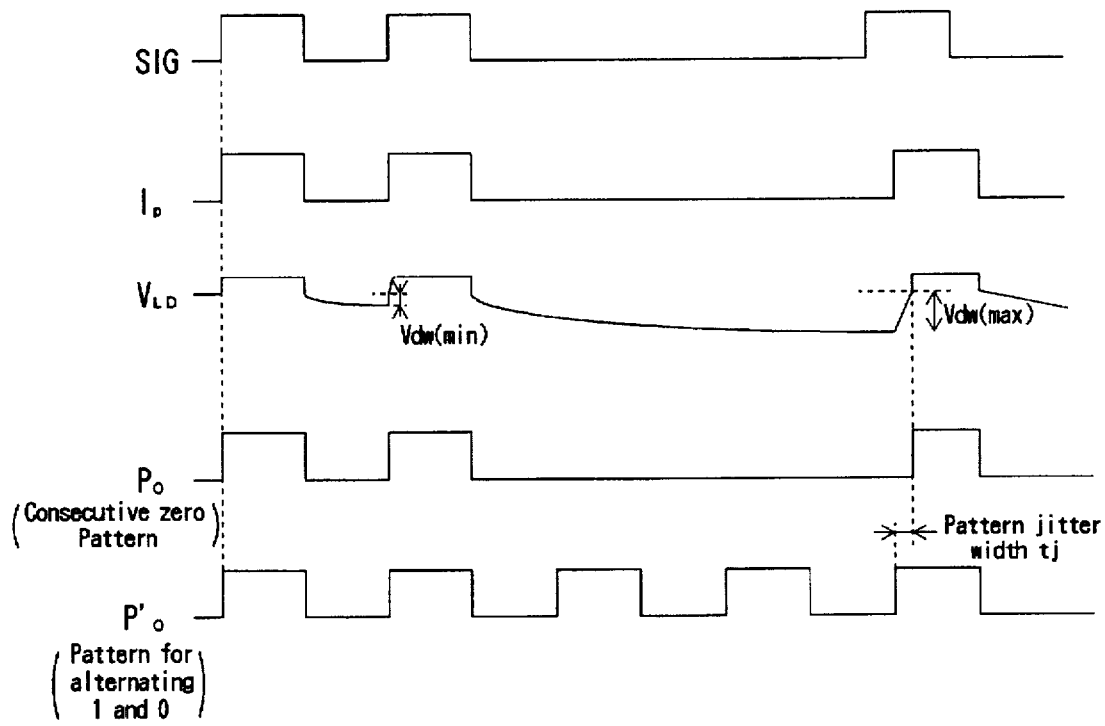
FIG. 37 shows waveforms of each section of a LD element in the conventional driver.

In the drawing illustrating waveforms shown in FIG. 37, SIG means an input signal SIG, and the signal driver current $I_P$ is shown in correspondence with the signal SIG. Further, in FIG. 37, $V_{LD}$ means a voltage of the laser diode LD. As the laser diode LD is provided with a diode parasitic capacitance $C_{LD}$, if zero values are continued in the input signal SIG, the voltage down Vdw is generated to the voltage $V_{LD}$ of the laser diode LD.

The voltage down Vdw is expressed by a function, of consecutive zero values as shown in FIG. 37, which is that as consecutive zero values of the input signal SIG become long, the voltage down Vdw becomes large.

More particularly, as considered that the bias current $I_B$ is zero, as shown in the equation (5), pattern jitter width tj becomes comes larger in proportion to the voltage down Vdw.

$$tj = \frac{CLD \cdot Vdw}{Ip} \quad (5)$$

where Vdw means a function of consecutive zero number.

When comparing the optical output waveform $P_O$ shown in FIG. 37, i.e., a consecutive zero pattern, and $P_{O'}$, i.e., a pattern alternating 1 and 0, the voltage down Vdw becomes large on the optical output waveform $P_O$. Therefore, timing lag is generated due to a pattern jitter width $t_j$.

The present invention has a feature of detecting a peak value and an average value in the output signal from the monitor PD, obtaining two of individual feed-back control signals and controlling each of the duty and the driver peak current $I_P$ based on each value, in order to solve the problem of the duty fluctuation as explained above.

The present invention has a second feature of regulating output voltage by switching arithmetic circuit device and a reference temperature characteristic in order to solve the problem of fluctuation of monitor voltage. The present invention has a third feature of fixing the laser diode voltage $V_{LD}$ to a certain value, when the input signal is zero, i.e., when the laser diode LD is off, in order to solve the problem of pattern jitter.

Hereinafter, embodiments realizing features according to the present invention will be explained.

FIG. 1 shows a block diagram illustrating an embodiment according to the present invention. The operation shown in FIG. 1 will be explained for simplicity. The laser diode driver includes a PD output monitor circuit 8 to amplify the light-receipt current of the light-receipt element PD and detect the peak current. A controller 50 of the signal driver current $I_P$ compares the peak current with a reference current and outputs it to the first LD driver 40.

The first LD driver 40 controls the peak current of the laser diode LD, based on the output from the controller 50 to stabilize the optical output. Further, the monitor circuit 8, which monitors the output of the light-receipt element PD, compares a waveform of the light-receipt current output of the light-receipt element PD with a reference waveform. According to the comparing result, the duty variable circuit 3 is controlled via the duty controller 30. Therefore, the duty of the optical output waveform of the LD can be stabilized.

Further, a temperature compensating circuit 60 controls switching for the LD current If with the use of an optical output power switching signal $V_S$. Simultaneously, the current outputted from the reference current generator 85 is switched to control switching two of output powers by the use of the switching signal $V_S$.

Figure 2:
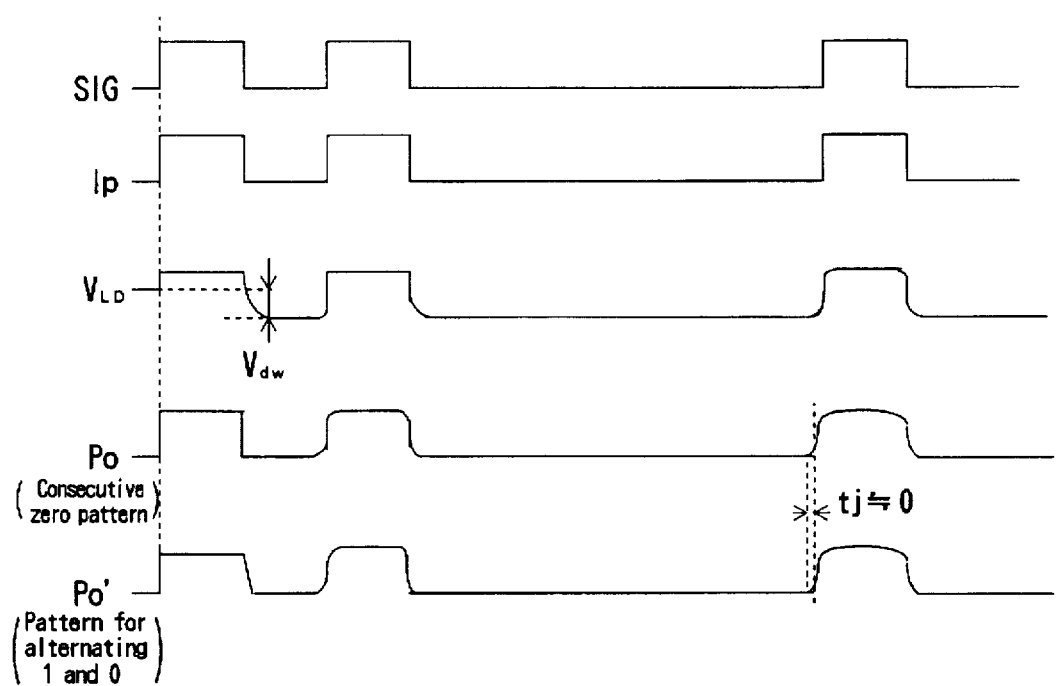
FIG. 2 is a diagram showing waveforms at each section of a LD element in FIG. 1.

Further, a charge absorption circuit 42 is provided to rapidly discharge electric charges of the diode parasitic element capacity $C_{LD}$, when the laser diode LD is switched to OFF. Therefore, as shown in a diagram illustrating waveforms of FIG. 2 in comparison with FIG. 37, pattern jitter on leading the optical output of the LD is reduced.

Figure 3:
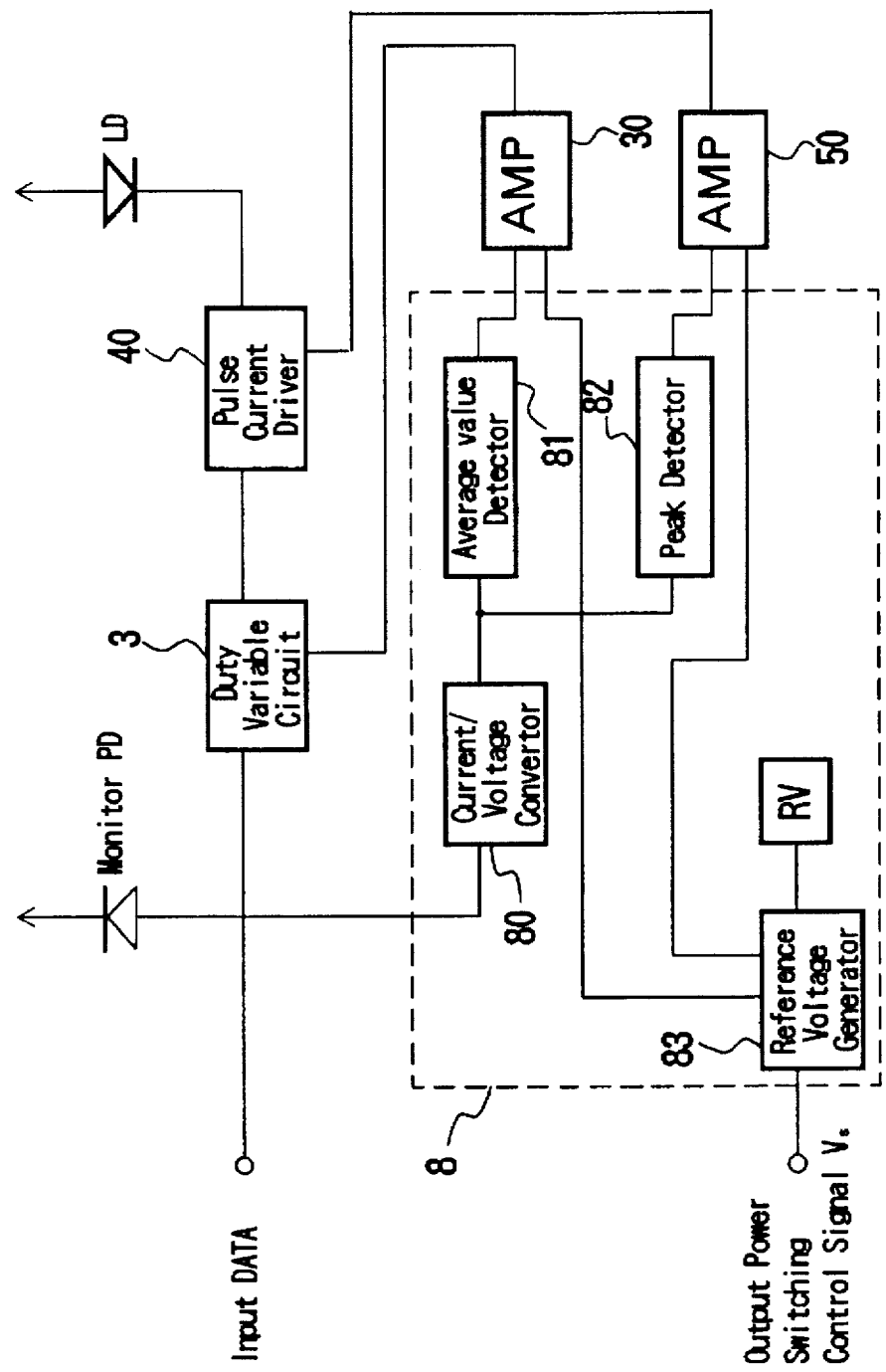
FIG. 3 is a diagram illustrating a first embodiment of an APC group.

FIG. 3 shows a block diagram illustrating a first embodiment of an APC group shown in FIG. 1. The symbols and numerals attached in each section forming an APC group are the same as those shown in FIG. 1.

In FIG. 3, the PD output monitor circuit 8 is formed of a current/voltage convertor 80, an average value detector 81, a peak value detector 82, and a reference voltage generator 83.

Further, the controller 50 for the signal driver current $I_P$ and the duty controller 30 are respectively formed of a comparison amplifier. In FIG. 3, the PD output monitor circuit 8 inputs the light-receipt current corresponding to optical output from the LD, which is received the light-receipt element PD, to the current/voltage convertor 80.

The current/voltage convertor 80 converts the inputted light-receipt current to corresponding voltage and outputs the corresponding voltage. The reference voltage generator 83 outputs two reference voltages, based on a predetermined potential voltage RV. The two of reference voltages are respectively switched and outputted by the output power switching signal $V_S$ to be inputted to the comparison amplifiers 30 and 50.

The voltage corresponding to the light-receipt current converted by the current/voltage convertor 80 is inputted to the average value detector 81 and the peak value detector 82. Since the voltage corresponding to the light-receipt current has a pulse waveform as shown with FIGS. 2 and 37, the average value detector 81 detects the average value, and the comparison amplifier 30 compares the average value with the reference value.

The comparison amplifier 30 compares the output from the average value detector 81 and the reference value, and inputs the differential signal to the duty variable circuit 3. The average voltage value is proportioned to the pulse width. Therefore, the duty variable circuit 3 controls varying pulse width required for the differential signal. As feed back control is performed so as that the output of the differential amplifier 30 be zero, it is controlled so as that the pulse width of the optical output waveform be constant.

On the other hand, the voltage corresponding to the light-receipt current converted by the current/voltage convertor 80 is inputted to a peak detector 82. The peak value detected in the peak detector 82 is inputted to a comparison amplifier 50. The comparison amplifier 50 compares the inputted peak value with a reference value outputted from the reference voltage generator 83 and outputs the differential signal.

The differential output signal is inputted to a pulse current driver 40 to control a size of the signal driver current for the LD. More particularly, feed-back control is performed so as that the output from the differential amplifier 50 be zero, and a size of the signal driver current of the LD is controlled. Therefore, an amplitude value of the optical output waveform becomes constant.

Figure 4:
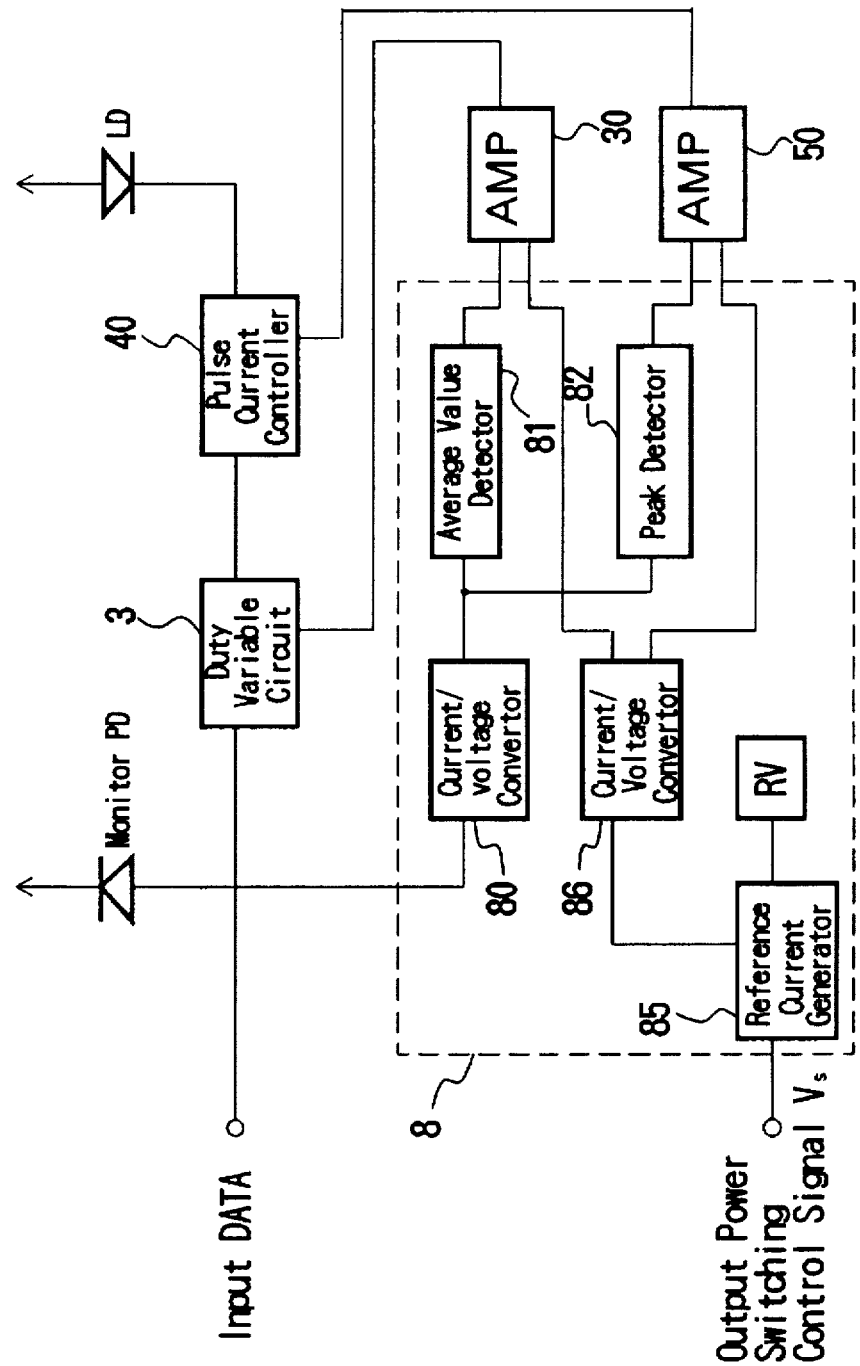
FIG. 4 is a diagram illustrating a second embodiment of an APC group.

FIG. 4 shows a block diagram illustrating the second embodiment of an APC group in the embodiment shown in FIG. 1. It is a different point from the embodiment shown in FIG. 3 that a reference voltage generator 85 is employed instead of the reference voltage generator 83, and further a current/voltage convertor 86 is provided to convert the output from the generator 85 to a voltage.

The current/voltage convertor 86 can be constructed as the same as a current/voltage convertor 80 for light-receipt current of the light-receipt element PD. Accordingly, it is possible to control the IP and the duty with a balance.

Figure 5:
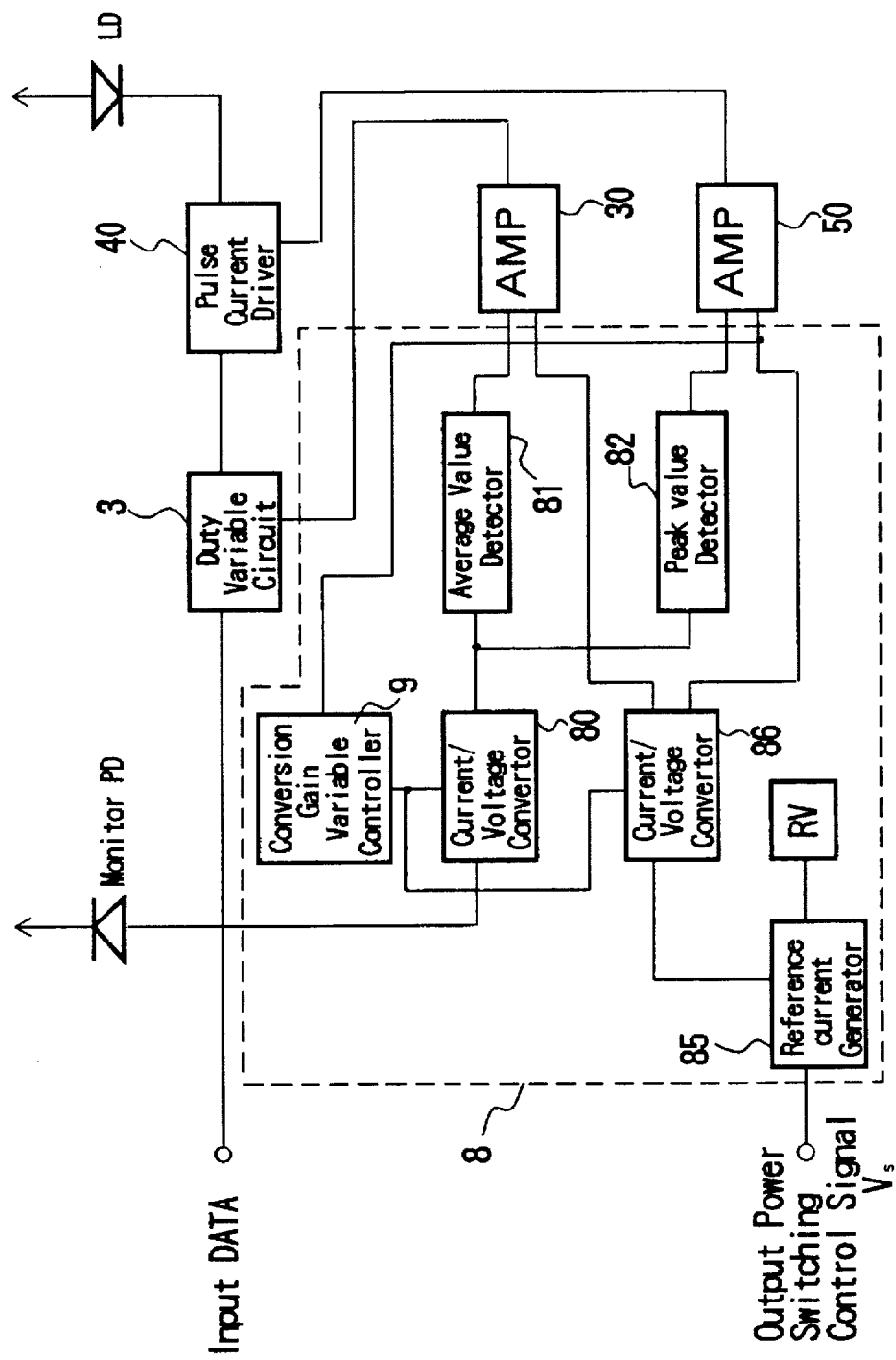
FIG. 5 is a diagram illustrating a third embodiment of an APC group.

FIG. 5 is a block diagram illustrating the third embodiment of an APC group. The structure shown in FIG. 5 has a conversion gain variable controller 9. The conversion gain variable controller 9 controls conductance of the current/voltage convertors 80 and 86, i.e., a conversion ratio. The conversion ratio to be controlled can be determined in correspondence with one output level of the current/voltage convertor 86.

The conversion gain variable controller 9 shown in FIG. 5 can increase the dynamic range for controlling IP and the duty.

Figure 6:
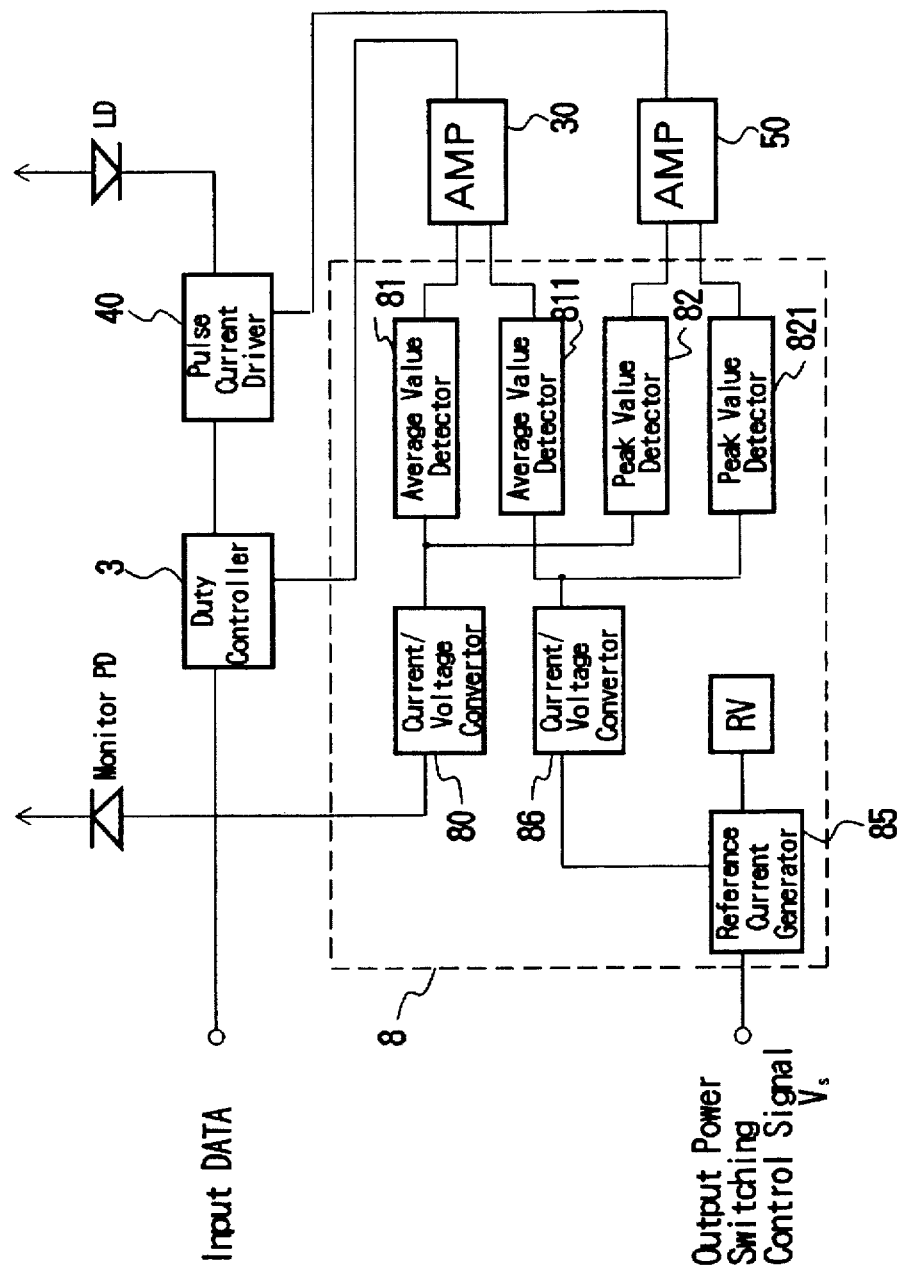
FIG. 6 is a diagram illustrating a fourth embodiment of an ADC group.

FIG. 6 shows a block diagram illustrating a fourth embodiment of an APC group for expanding the structure shown in FIG. 4. To keep a balance between the outputs of the current/voltage convertors 80 and 86, an average value detector 811 and a peak detector 821 are provided to be prepared with the average value detector 81 and the peak detector 82, respectively. The average value detector 811 and the peak detector 821 are connected between the current/voltage convertor 86 and the comparison amplifier 50.

Figure 7:
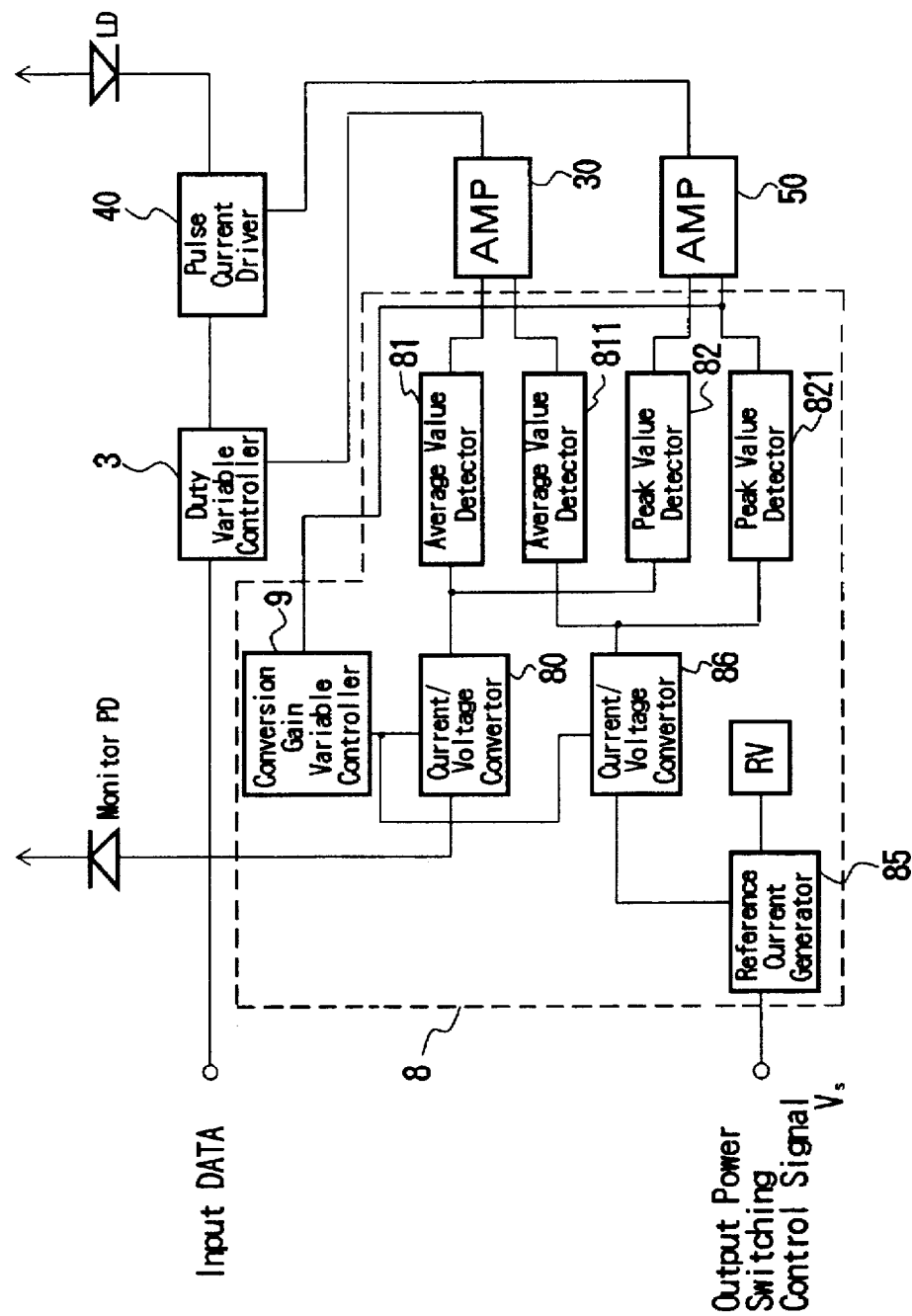
FIG. 7 is a diagram illustrating a fifth embodiment of an APC group.

FIG. 7 is a block diagram showing a fifth embodiment of an APC group. A structure shown in FIG. 7 provides the conversion gain variable controller 9 shown in FIG. 5 to control conductance of the current/voltage convertors 80 and 86 and increase dynamic range for control. Other operational functions are the same as those of the above-described embodiments.

Figure 8:
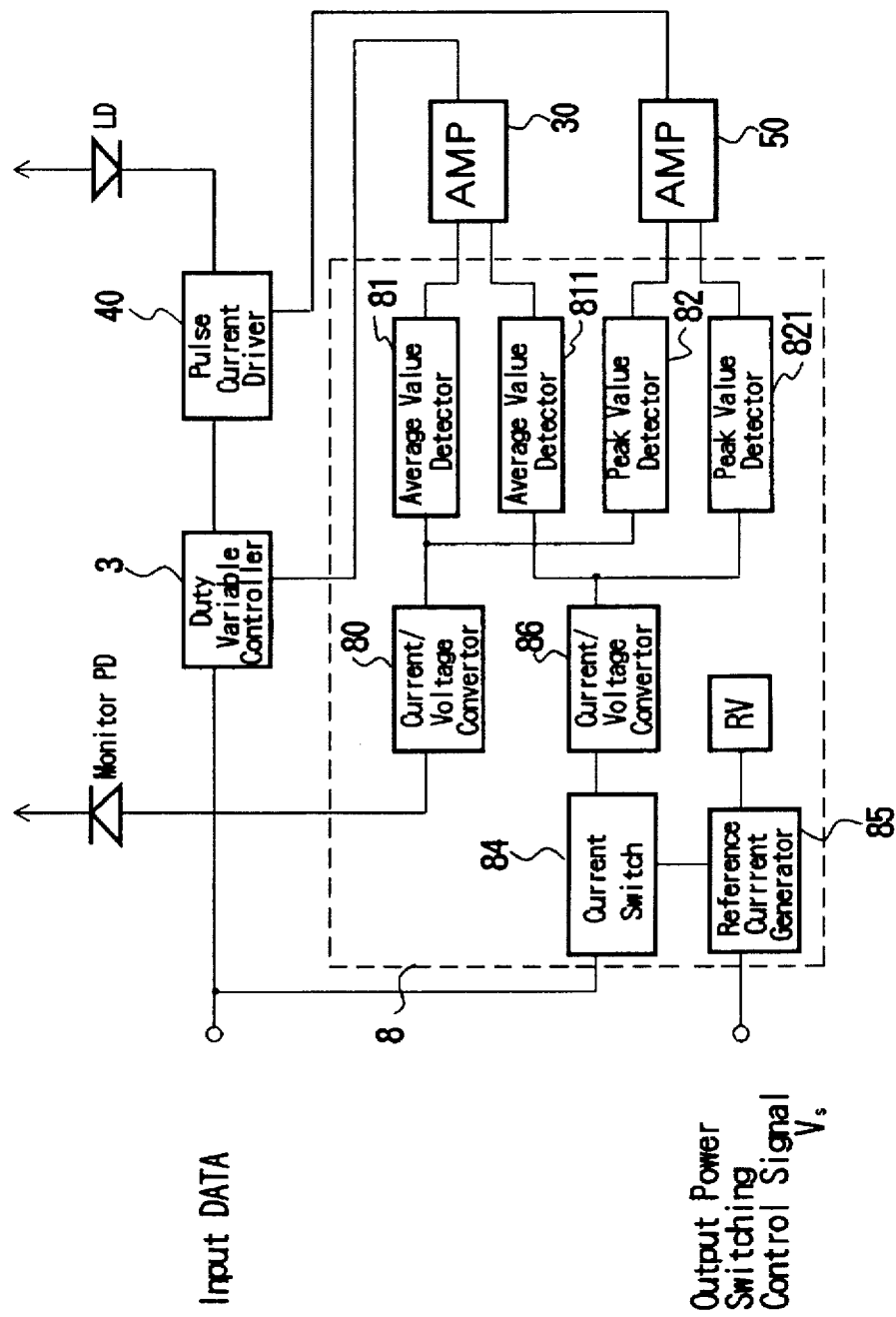
FIG. 8 is a diagram illustrating a sixth embodiment of an APC group.

FIG. 8 is a block diagram showing a sixth embodiment of an APC group. In the above-described embodiments, the case where the input signal data is the mark ratio of 1/2 will be considered. Accordingly, it is difficult to apply to the case other than the mark ratio of 1/2.

The structure shown in FIG. 8 includes a current switch 84 to solve the above-described condition. The current switch 84 converts the output of the reference current generator 85 based on a timing of the input signal data, i.e., the input of the duty variable circuit 3, to an alternate current having a predetermined period, based on an input timing, i.e., input signal data. It is possible to apply the LD driver according to the present invention to the case of any optional mark ratio.

Figure 9:
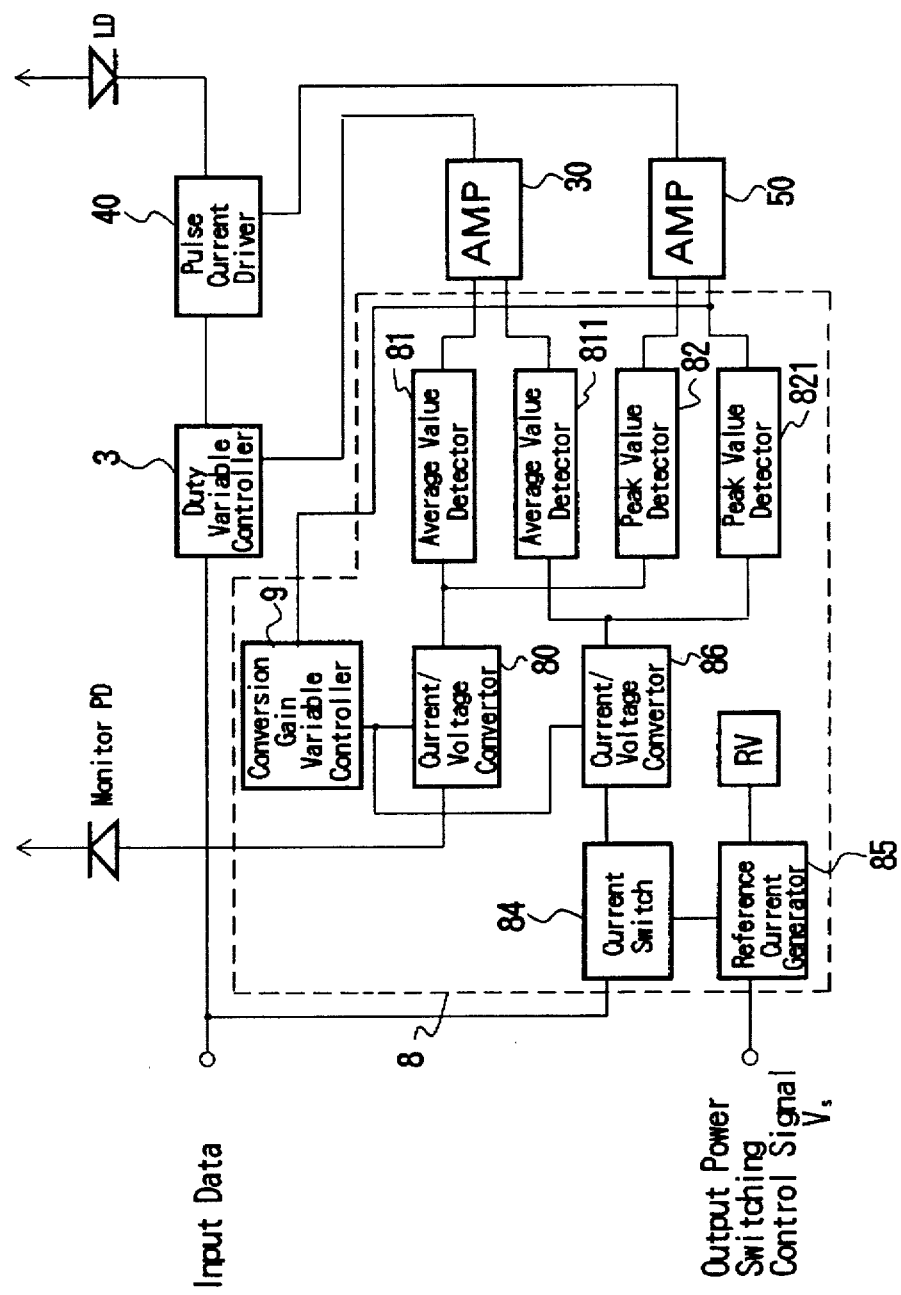
FIG. 9 is a diagram illustrating a seventh embodiment of an APC group.

FIG. 9 shows the structure of FIG. 8 further having a conversion gain variable controller 9, which variably controls the conversion gain for the current/voltage convertors 80 and 86 to increase dynamic range of controlling as the same as the embodiment shown in FIG. 5. Other structural functions are the same as those shown in the above-described embodiments.

The embodiments shown in FIGS. 10 to 13 have a structure having an offset regulator 87, which adjusts a relative offset to compensate the dispersion of a pair of circuits. Even if the circuits are manufactured under the same step as semiconductor ICs, it is difficult to prevent from dispersion between the semiconductor ICs. Accordingly, the offset regulator 87 may be employed to compensate dispersion between the semiconductor ICs.

For example, the outputs of the current/voltage convertors 80 and 86 become different, even when the inputs to the convertors are commonly zero, and thus the difference is detected as an offset.

Accordingly, an offset regulator 87 supplies an offset adjusting value to both of the inputs of the current/voltage convertors 80 and 86 so as to cancel the offset.

Figure 10:
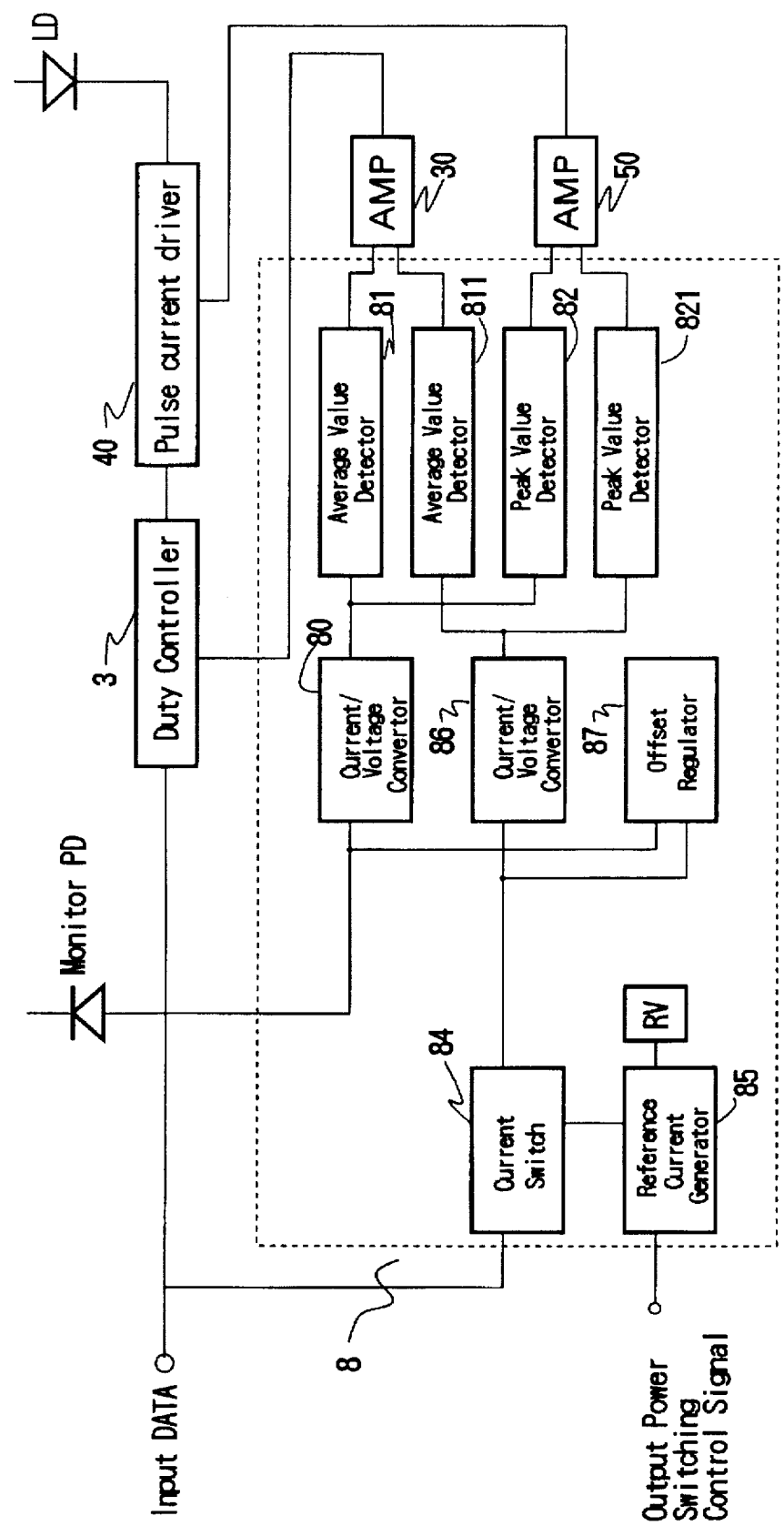
FIG. 10 is a diagram illustrating an eighth embodiment of an APC group.
Figure 11:
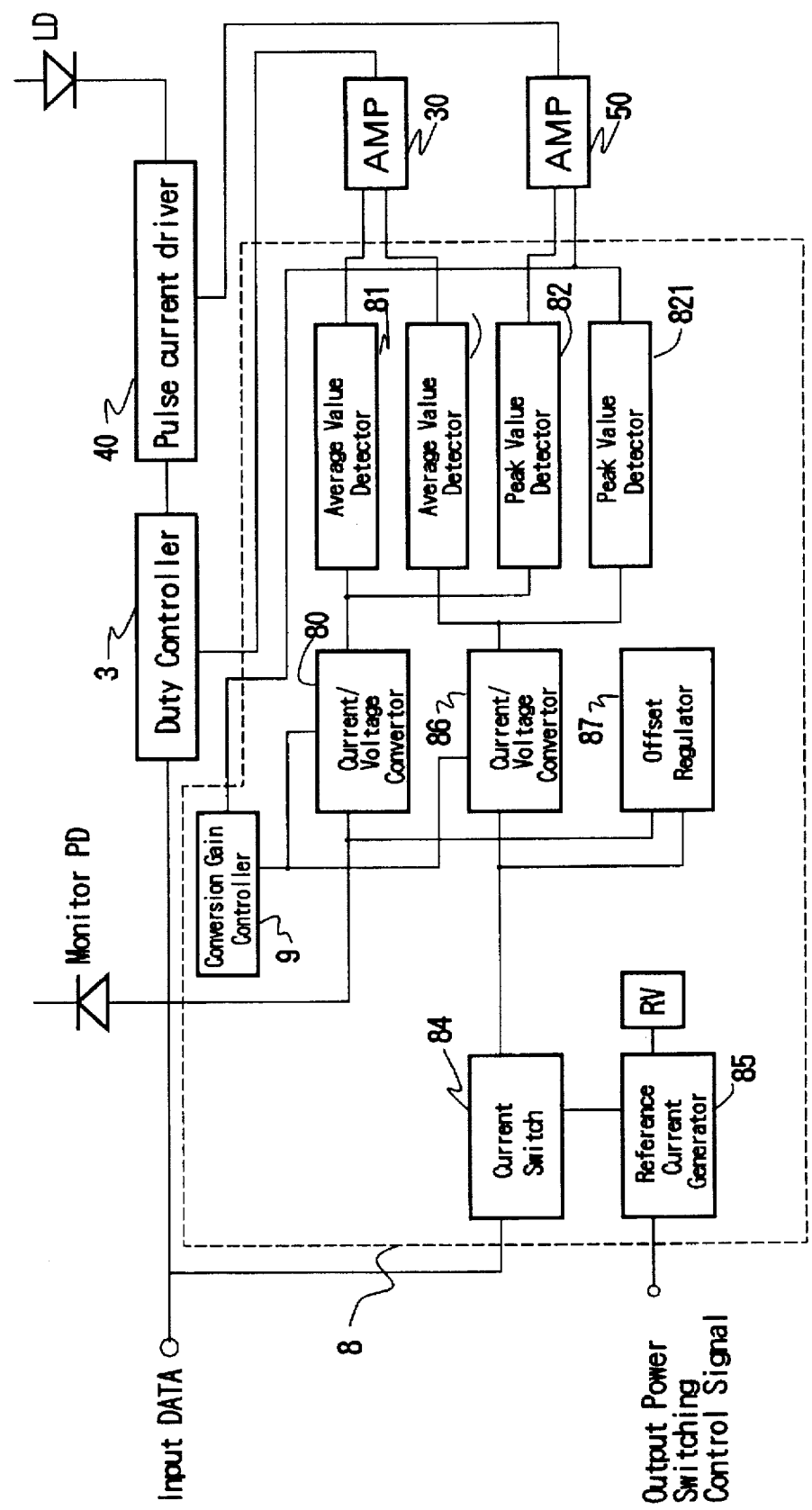
FIG. 11 is a diagram illustrating a ninth embodiment of an APC group.
Figure 12:
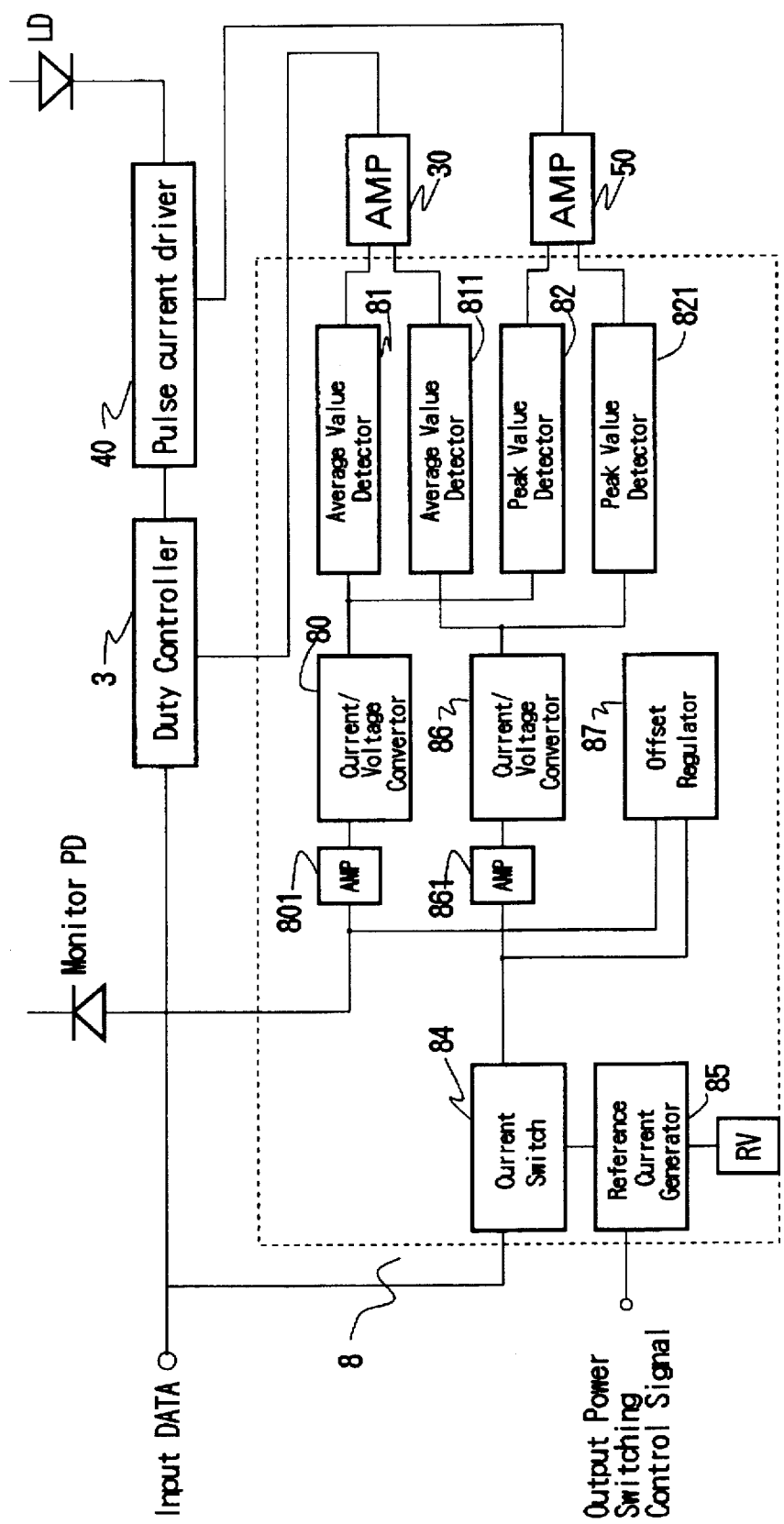
FIG. 12 is a diagram illustrating a tenth embodiment of an APC group.
Figure 13:
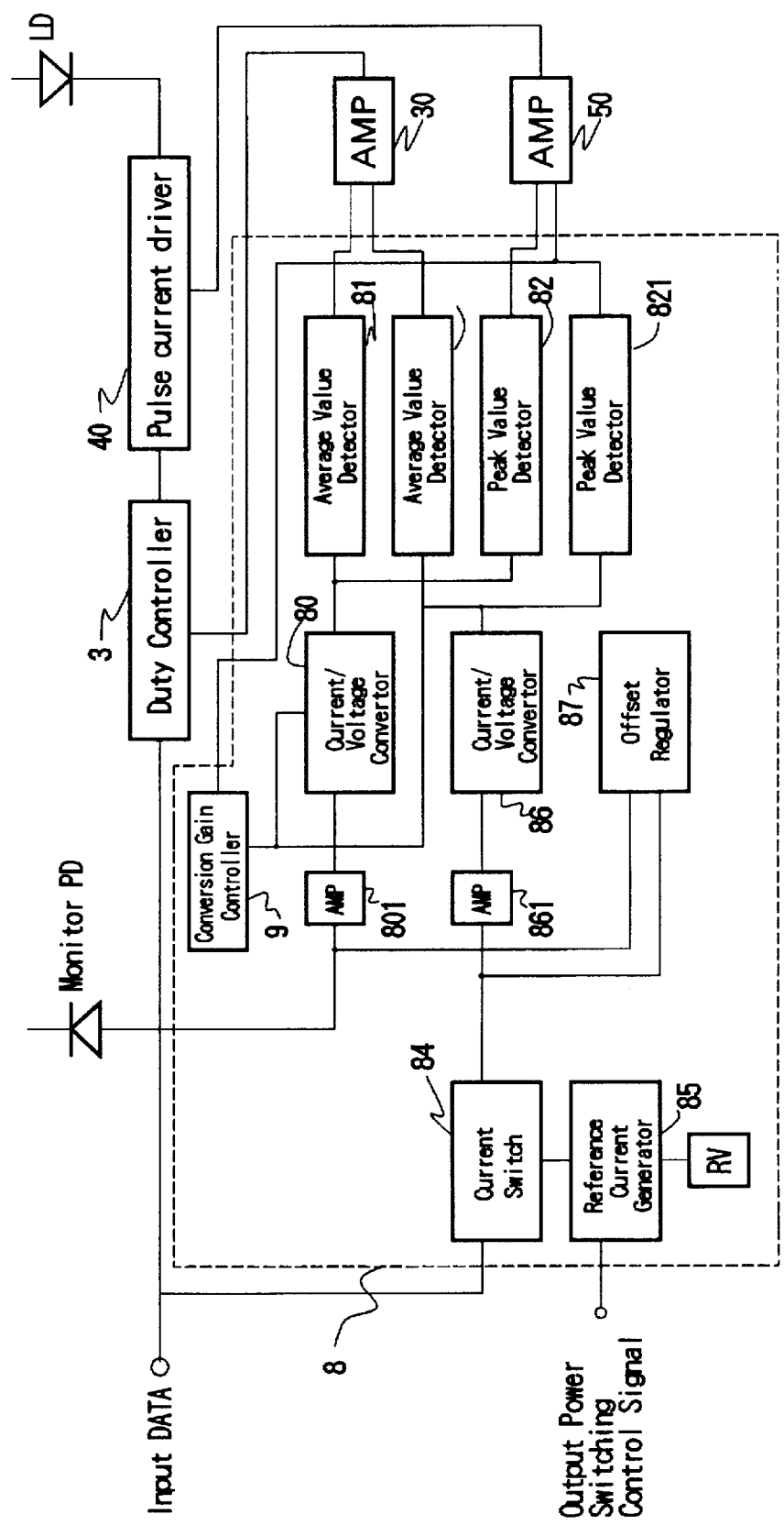
FIG. 13 is a diagram illustrating an eleventh embodiment of an APC group.

FIGS. 10 and 11 show the structures, in which an offset regulator 87 is provided to each of the structures shown in FIGS. 8 and 9. FIGS. 12 and 13 show the structures, in which current amplifiers 801 and 861 are provided on the previous stages of the current/voltage convertors 80 and 86, and the offset regulators 87 is connected to each of the input sides of the current amplifiers 801 and 861. Therefore, it is possible to improve accuracy of adjusting offsets.

Examples of structural parts, which are commonly used in the above-described embodiments, will be explained.

Figure 14:
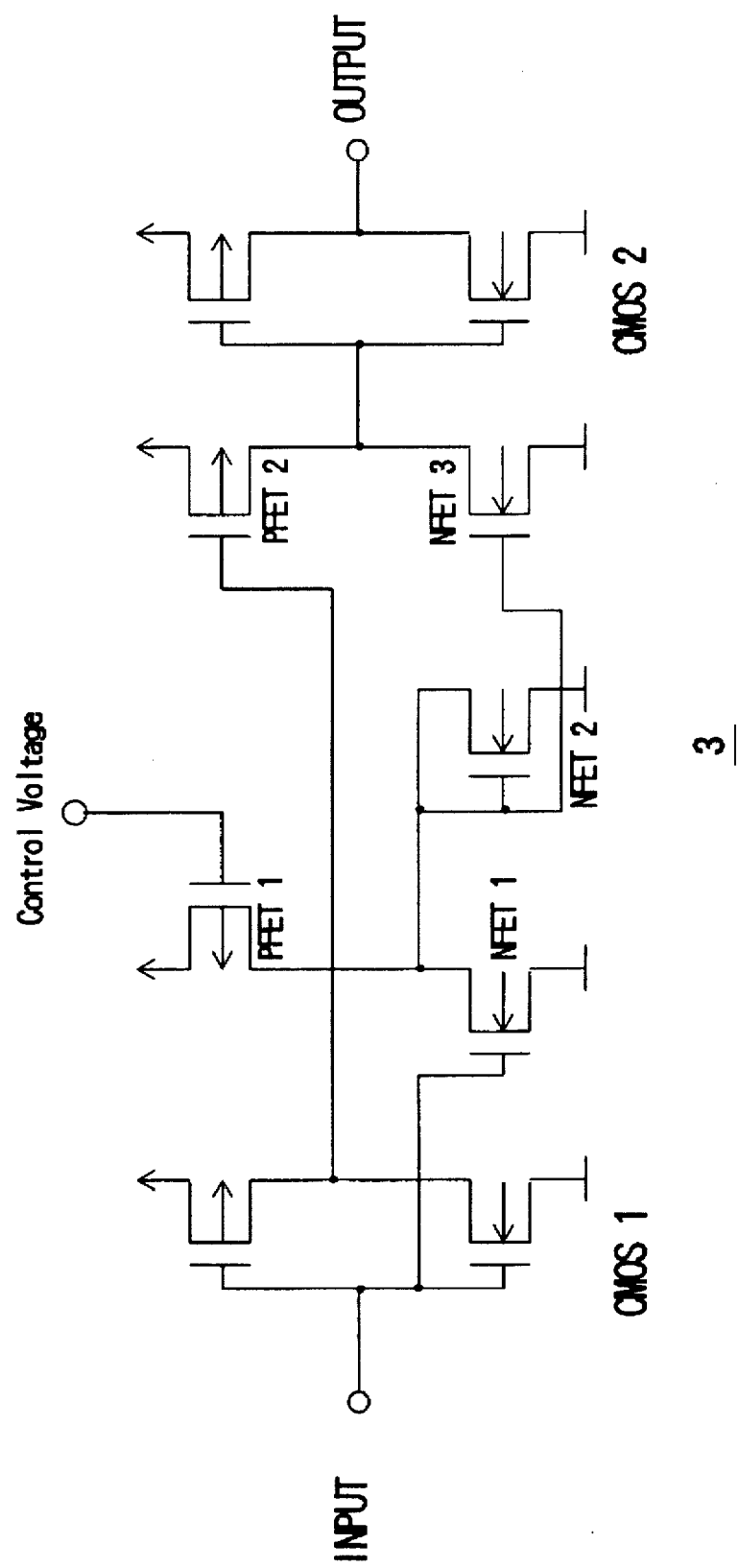
FIG. 14 shows an embodiment of a duty variable circuit.

FIG. 14 shows an example of a duty variable circuit 3. An input signal data is inputted to an input terminal of a CMOS 1 on the first stage. An output terminal of the CMOS 1 is connected to a pulse current driver 40. The output of the CMOS 1 on the first stage is connected to an input terminal of a CMOS 2 on the second stage through a Pch FET 2.

Meanwhile, an input of the CMOS 1 on the first stage is connected to the input terminal of the CMOS 2 on the second stage through a Nch FET1. A Pch FET1, to which a control voltage, i.e., an average value outputted from the comparison amplifier 30 is supplied, is connected to the Nch FET1.

Accordingly, shifting of leading and trailing timings of the input signals transmitted through the Nch FETs 1 to 3, is controlled in correspondence with the control voltage, i.e., a size of the average value outputted from the comparison amplifier 30. Therefore, the duty of the input signal can be varied.

Figure 15:
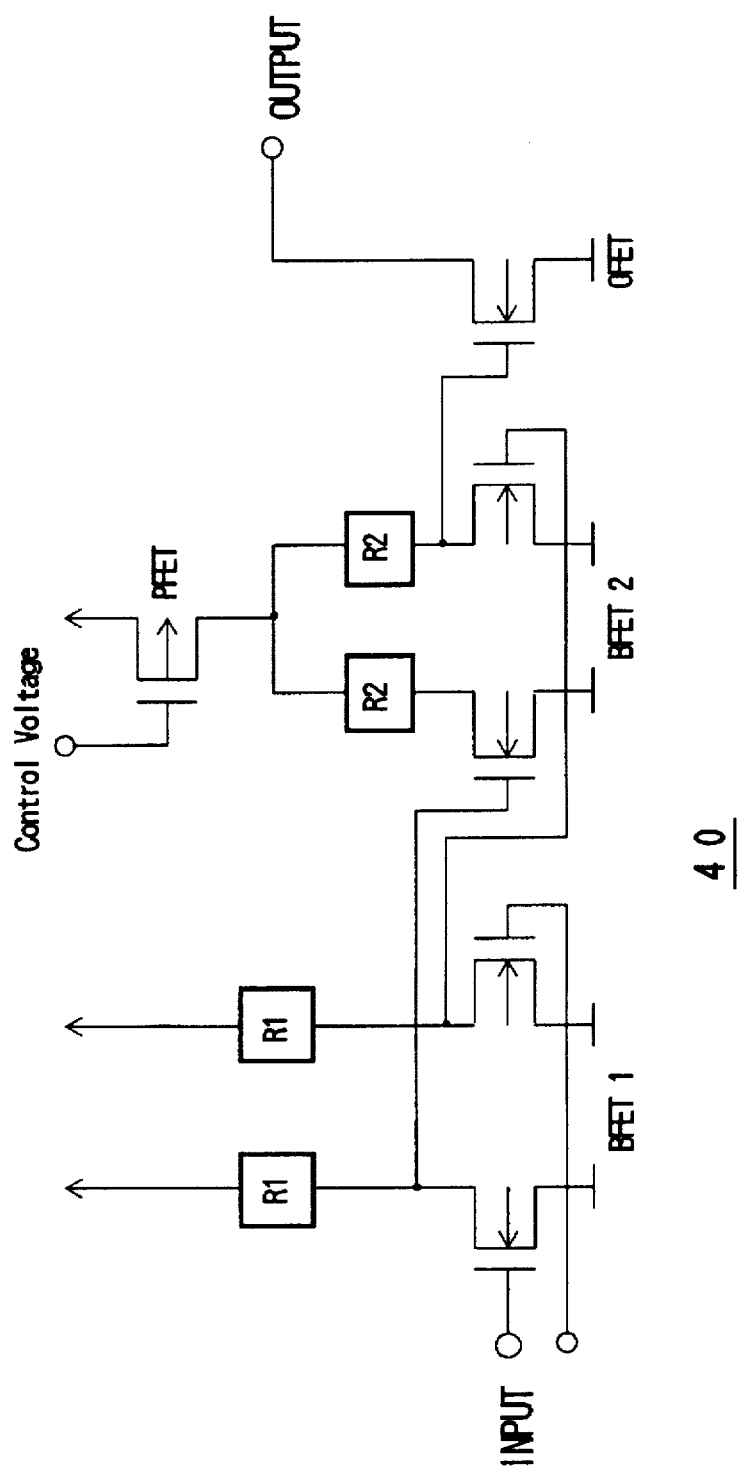
FIG. 15 shows an embodiment of a pulse current driver.

FIG. 15 shows an example of the pulse current driver 40. The pulse current driver 40 includes two stages of buffer amplifiers BFET 1 and BFET 2, which respectively are of a pair of Nch FETs, an output buffer amplifier OFET, and a Pch buffer PFET.

Control voltage, i.e., the peak value detected from the comparison amplifier 50, is inputted to the Pch PFET. The Pch buffer PFET is connected to the buffer amplifier BFET 2 on the second stage, which is formed of a pair of Nch FETs. Further, the output of the buffer amplifier BFET 2 is connected to the output buffer amplifier OFET of a Nch FET.

Accordingly, the output of the output buffer amplifier OFET is controlled to be contrast to the size of the control voltage. Therefore, a laser driver current is controlled to be of a constant size by negatively feeding back the peak value of the optical output and then, an optical output of the laser diode LD can be controlled to keep a constant value.

Figure 16:
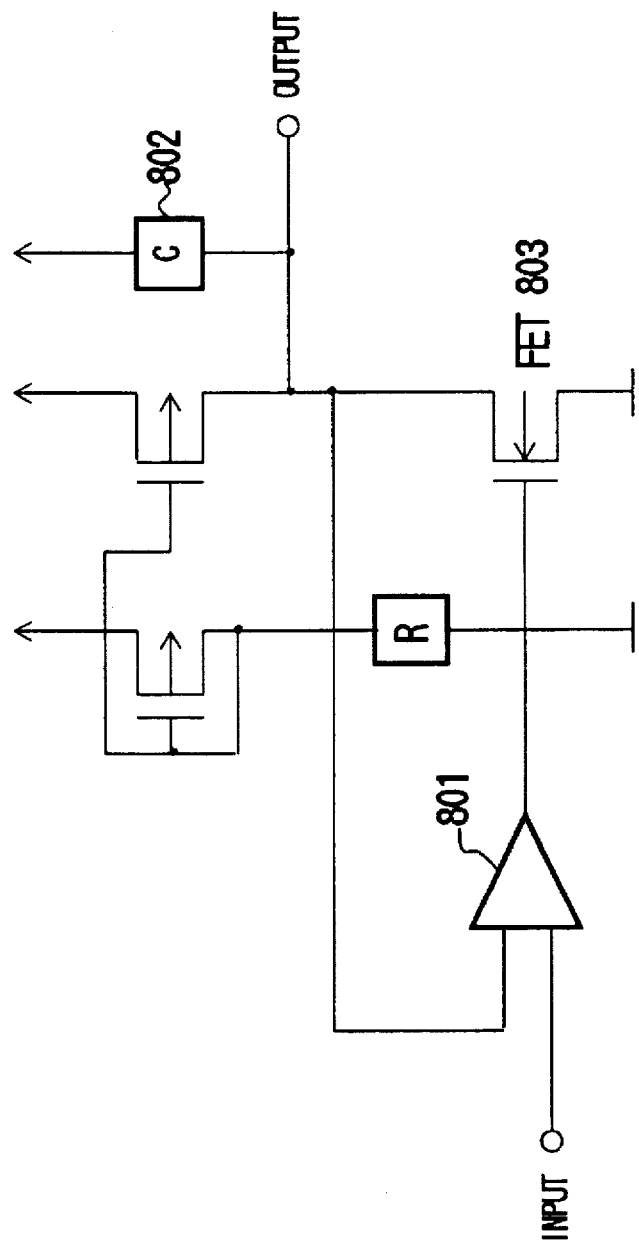
FIG. 16 shows an embodiment of a peak detector.

FIG. 16 shows an example of the peak detector provided in the output monitor circuit 8, which monitors the output of the light-receipt element PD. Each of the peak detectors 82 and 821 has the same structure. FIG. 16 shows a commonly-used structure of the peak detectors. In FIG. 16, the outputs from the current/voltage convertor 80 or 86 is inputted to the input terminal of the peak detector 82 or 821.

In FIG. 16, the output of the current/voltage convertor 80 is inputted to an input terminal of the comparison amplifier 801. A potential of the output terminal is inputted to the other input terminal of the comparison amplifier 801. Further, a capacitor 802 is connected to the output terminal. Accordingly, output current is flowing through the FET 803 to a direction for charging the capacity 802, until a voltage potential of the output of the comparison amplifier 802 corresponds to a potential of the capacitor 802, i.e., a potential of the output terminal.

Therefore, a peak value level is charged to the capacitor 802 and is outputted. In FIG. 16, further other FETs and resistors give a predetermined DC voltage bias to the output terminal of the FET 803.

Figure 17:
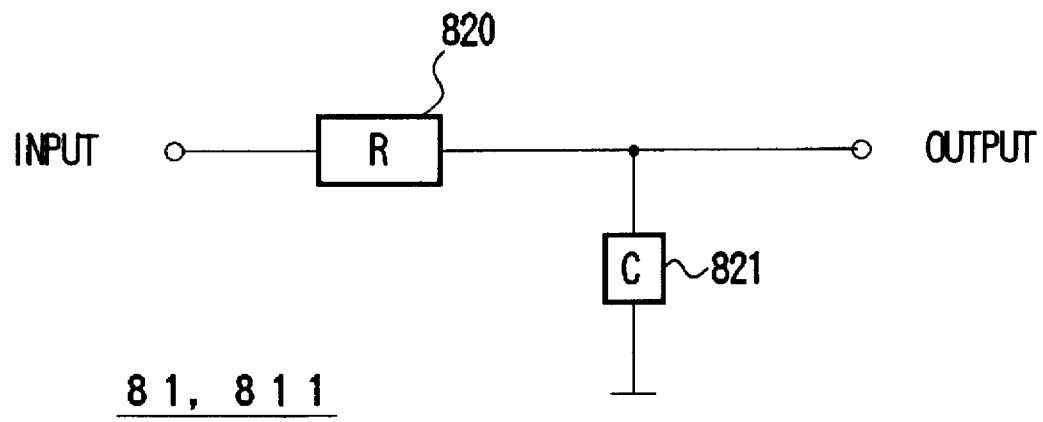
FIG. 17 shows an embodiment of an average value detector.

FIG. 17 shows an example of the average value detector provided in the output monitor 8, which monitors the output of the light-receipt element PD. Further, the average value detectors 81 and 811 have the same structure. Therefore, FIG. 16 shows a commonly-used structure of the average value detectors 81 and 811. In FIG. 17, the output of the current/voltage convertor 80 or 86 is inputted to the input terminal of the average value detector 81 or 811.

In FIG. 17, the output of the current/voltage convertor 80 is inputted to the resistor 820. The output signal is charged to the capacity 821 through the resistor 820. FIG. 17 forms an integral circuit, so that the output signal of the integral circuit becomes an average value of the input signal. The output of the integral circuit shown in FIG. 17 is inputted to the comparison amplifier 30.

Figure 18:
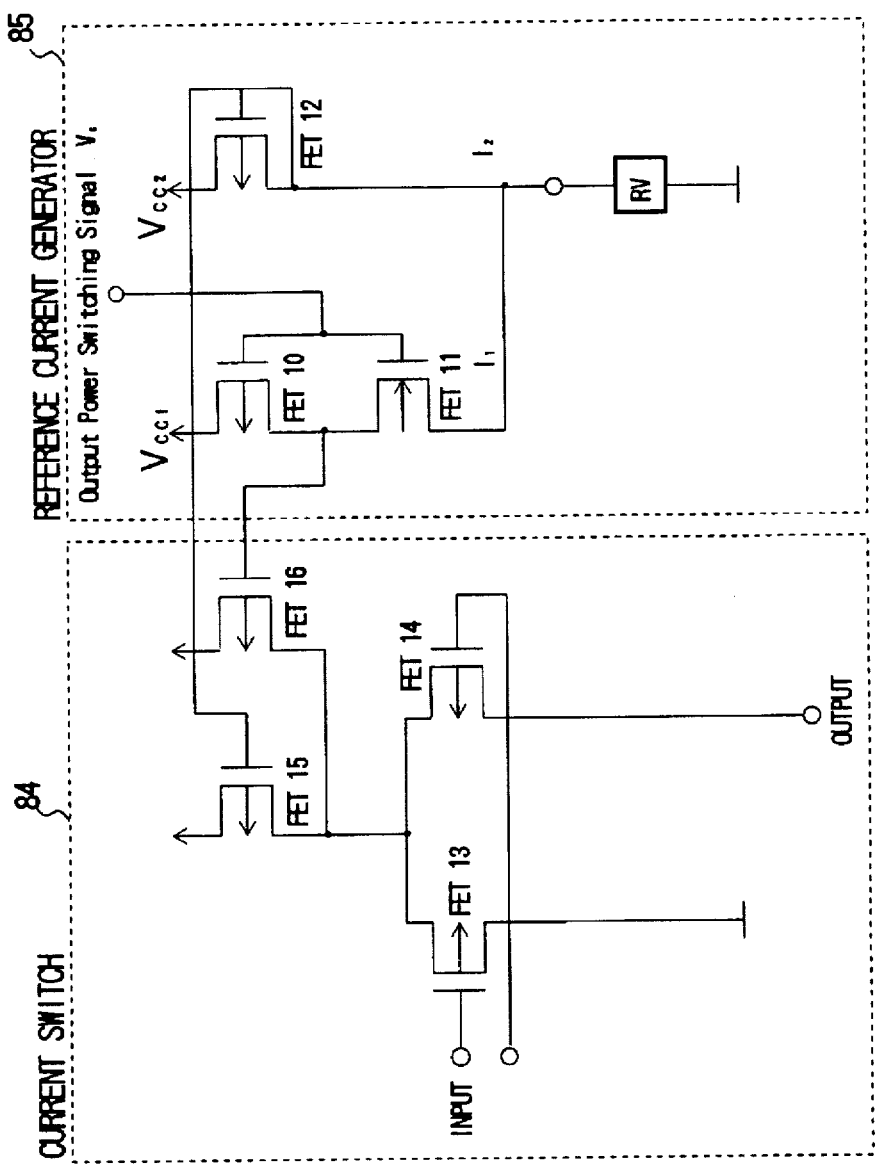
FIG. 18 shows an embodiment of current switching and reference current generators.

FIG. 18 shows a structural example of the reference current generator 85 and the current switch 84 shown in FIG. 8. In FIG. 18, the reference current generator 85 includes two constant current sources formed of the FETs 10, 11 and 12, which are connected to the voltage sources $V_{CC1}$ and $V_{CC2}$, and a common resistor RV.

The FETs 10 and 11 connected to the voltage source $V_{CC1}$ and form a CMOS circuit, which controls the conductivity of a constant current $I_1$ according to an output power switching control signal $V_S$.

Meanwhile, a current switch circuit 84 is formed of the FETs 13 and 14 for switch, of which switching is controlled by the input signal, and the buffer FETs 15 and 16. When the FET 14 becomes conductive according to the input signal, the output current of the buffer FETs 15 and 16 are composed and outputted.

Accordingly, the reference current generator 85 outputs the constant currents $I_1$ and $I_2$ with the output power switching control signal $V_S$, and then, the composed current $I=I_1+I_2$ is outputted from the current switch 84 as an alternative current, in correspondence to the input signal.

Further, when the output power switching control signal $V_S$ stops the output of the constant current $I_1$, an alternative current corresponding to a size of the constant current $I_2$ flowing through the FET 15 is outputted from the current switch 84.

Figure 19:
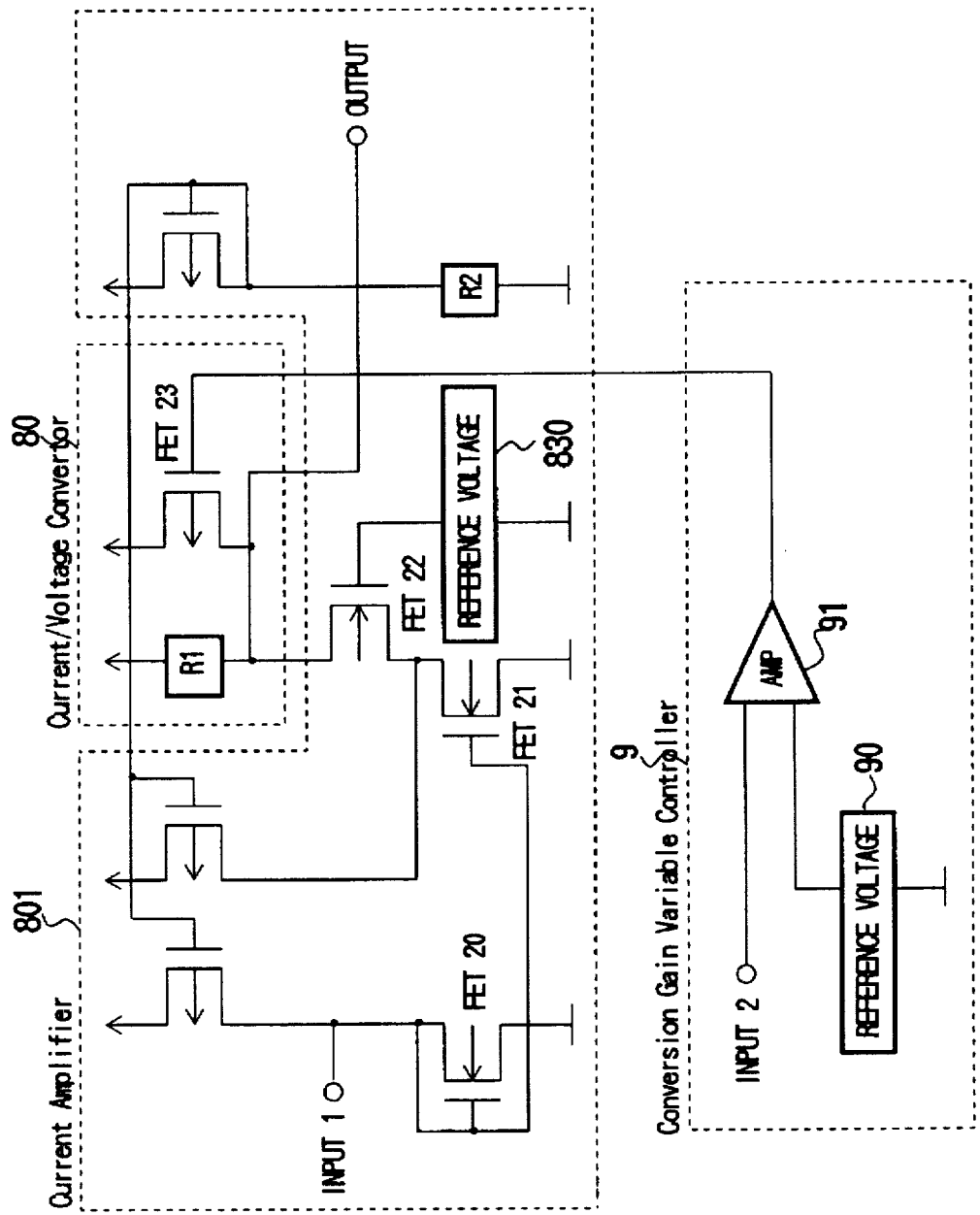
FIG. 19 shows an embodiment of current amplifying, current voltage conversion and a conversion gain variable controller circuit.

FIG. 19 shows a structural example of the current amplifier 801, the current/voltage convertor 80 and the conversion gain variable controller 9, for example, shown in FIG. 13. The amplifier 861 and the current/voltage convertor 86 correspond to the current amplifier 801 and the current/ voltage convertor 80, respectively. Accordingly, FIG. 19 shows a structure commonly used in the current amplifier 801 and the current/voltage convertor 80.

In the current amplifier 801, the FETs 20 and 21 form a current mirror circuit. Further, a gate dimension of the FET 21 is larger than that of the FET 20. Therefore, a current flowing through the FET 20 is proportioned to and larger than the current, which is flowing to the FET 20.

The FET 22 is connected to the FET 21 in series. A reference voltage 830 is supplied to the gate of the FET 22. The FET 22 has a function for converting impedance and can make a load impedance of the FET 21 small. Therefore, it may be possible not to make the bandwidth narrow by increasing the gate dimension of the FET 21.

Meanwhile, the current/voltage convertor 80 includes a fixed resistor R1 connected to the FET 21 in series and a variable resistor of the FET 23 connected to the fixed resistor R1 in parallel. The current of the series circuit of the FETs 21 and 22 is flowing to a parallel circuit formed of the fixed resistor R1 and the FET 23. Accordingly, the potential of the parallel circuit of the fixed resistor R1 and the FET 23 is proportioned to the current of the series circuit formed of the FETs 21 and 22.

Further, by controlling the impedance of the variable resistor due to the FET 23 with the output of the conversion gain variable controller 9, the conversion gain of the current/ voltage convertor 80 can be changed.

The conversion gain variable controller 9 includes a reference voltage 90 and a comparison amplifier 91, which compares the input signal 2 with the reference voltage 90. Accordingly, the control voltage proportioned to a level of the peak value detected in the peak detector 822 is outputted from the comparison amplifier 91.

The output signal from the comparison amplifier 91 controls an impedance of the FET 23 in the above-described current/voltage convertor 80 to be small, as the level of the detected peak value is large, and contrarily to be large, as the level of the peak value is small. Therefore, as described above, it is possible to control the peak level of the optical output of the laser diode to be constant.

Figure 20:
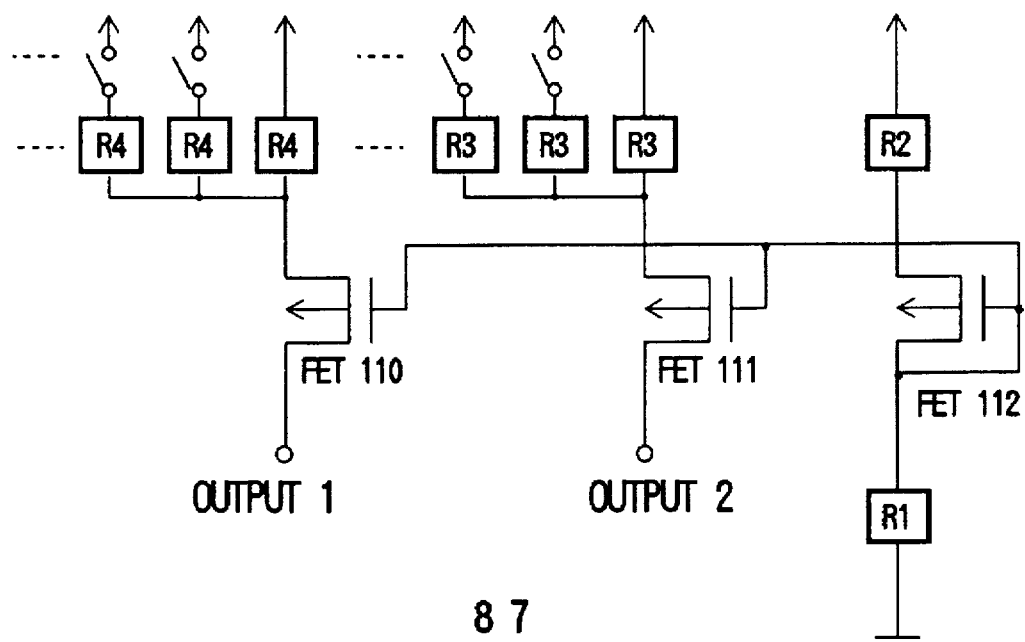
FIG. 20 shows an embodiment of an offset regulator.

FIG. 20 shows an example of the offset regulator 87. In the example of FIG. 20, the offset regulator 87 includes the FETs 110, 111 and 112, and the FETs 110 and 111 form mirrored circuits for FET 112.

Resistors R1 and R2 give a predetermined bias voltage so as to flow a predetermined current to the FET 112. Accordingly, currents, of which sizes are determined by the resistors R4 and R3, respectively flow through the FETs 110 and 111 forming the mirrored circuit and are outputted to the output terminals 1 and 2, respectively.

Then, the resistors R4 and R3 are adjusted to make the output signal from the output terminal 1 different from that of the output terminal 2. Therefore, for example, it becomes possible to cancel the offset between the currents respectively on the input sides of the current on the input side of the current/voltage convertors 80 and 86 in FIG. 10.

Returning to a principle diagram of the present invention shown in FIG. 1, the arithmetic circuit 70 and the level convertor 71 form a PD current monitor group for obtaining the PD current monitor voltage $V_{MP}$ from the light-receipt element PD.

Figure 21:
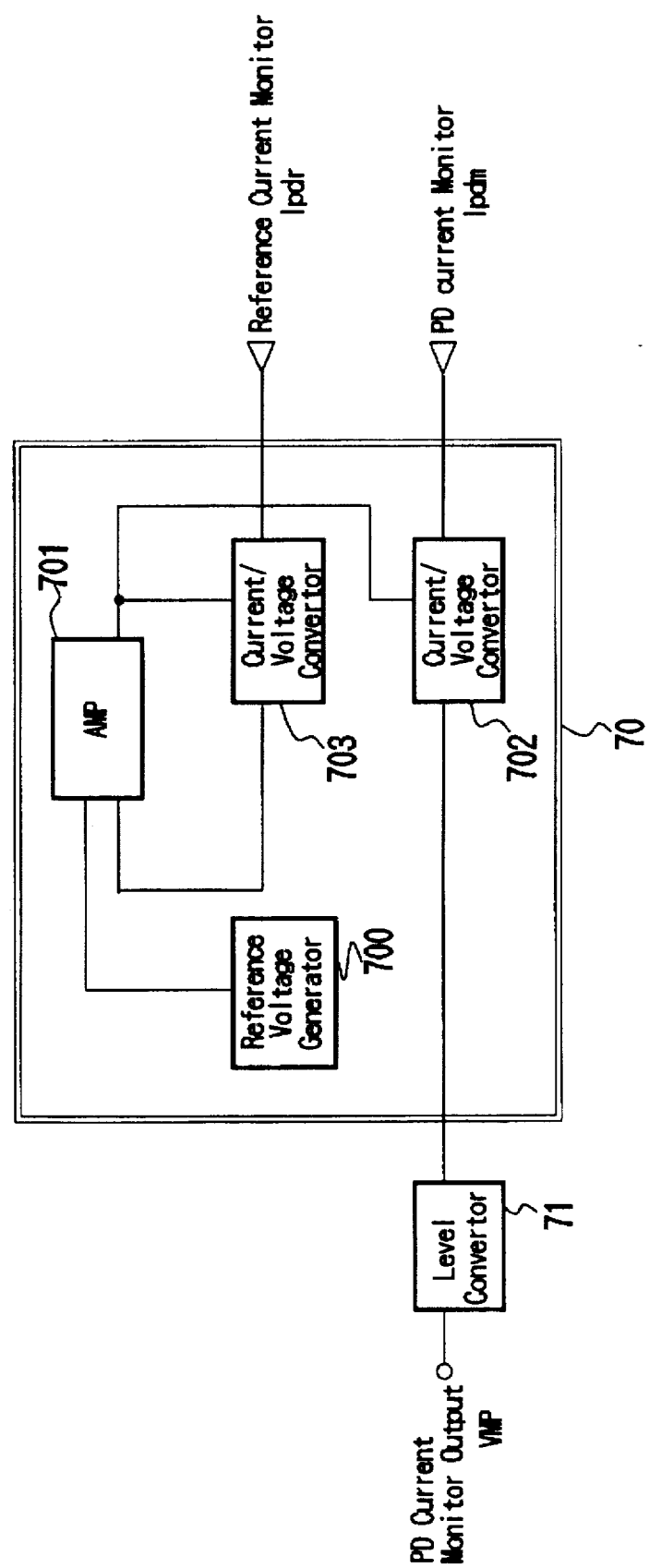
FIG. 21 shows an embodiment of a PD current monitor group.

FIG. 21 shows one structural example of the PD current monitor group. In FIG. 21, a structure has a feature as to the arithmetic circuit 70. The arithmetic circuit 70 includes two current/voltage convertors 702 and 703, of which gain can be variable. The two current/voltage convertors 702 and 703 have the same structure shown in FIG. 19, i.e., a circuit for flowing current through a variable impedance, and converts the current to a voltage by varying a gain of the circuit.

Further, Ipdm, which is a light-receipt current sent from the light-receipt element PD in the monitor circuit 8 and a reference voltage Ipdr, which is supplied from the reference current generator 85, are supplied to each of the current/ voltage convertors 702 and 703.

Further, the arithmetic circuit 70 includes a reference voltage generator 700 and a comparison amplifier 701. The comparison amplifier 701 amplifies the difference between the converted voltage corresponding to the reference current Ipdr from the current/voltage convertor 703 and the reference voltage output signal from the reference voltage generator 700. The conversion gain of the current voltage convertor 702 can be varied with the output signal.

The current/voltage convertor 702 converts and outputs the PD current to the voltage with the gain controlled by the output signal of the comparison amplifier 701. The output signal of the current/voltage convertor 702 is converted to the predetermined level by the level convertor 71 to output as the PD current monitor voltage $V_{MP}$. As described above, the gain of the current/voltage convertor 702 is variably controlled.

Then, the converted output signal of the current/voltage convertor 703 is expressed as Vr, which is equal to R·Ipdr. Further, the converted output signal of the current/voltage convertor 702 is expressed as $V_O$, which is equal to R'·Ipdm.

If the conversion gain R or R' is equally set, $V_O$=Vr·Ipdm/Ipdr. Further, the PD current is normalized and outputted, and therefore, it is possible to make a dynamic range be large for monitoring the PD current.

Figure 22:
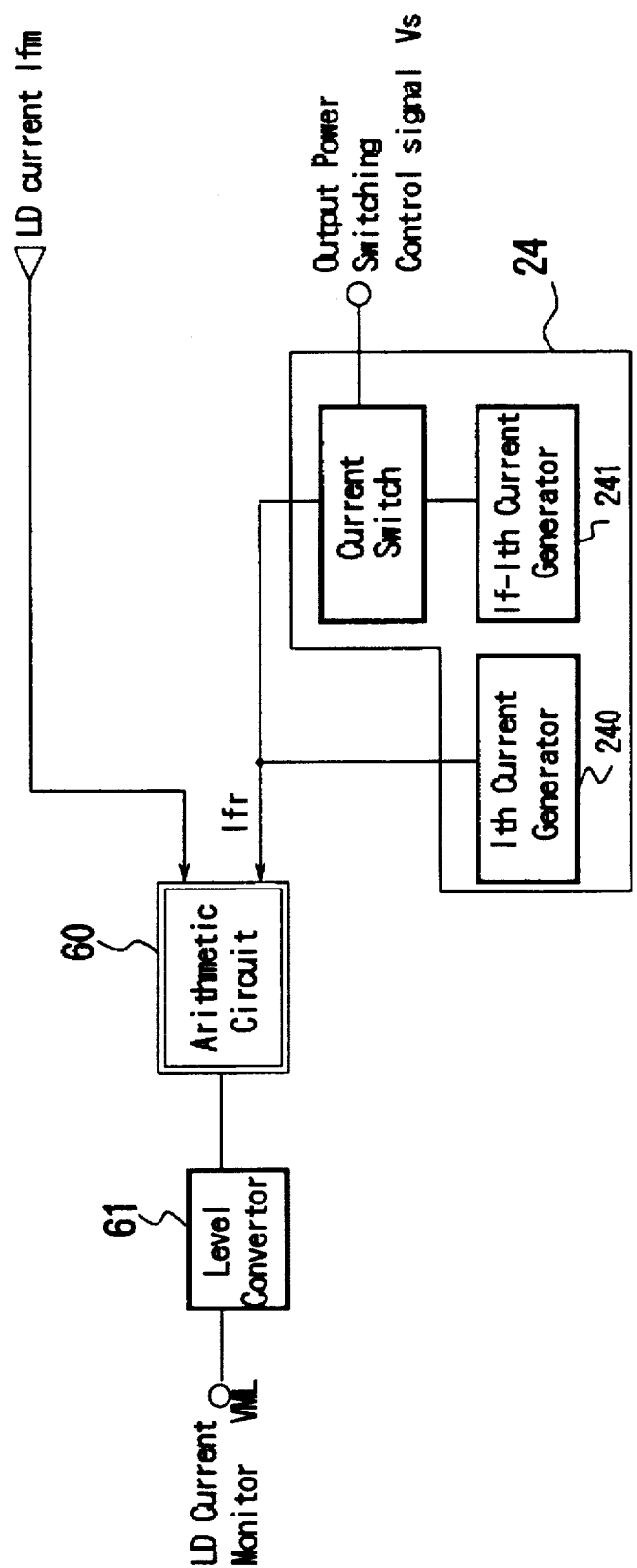
FIG. 22 shows a first embodiment of a PD current monitor group.

FIG. 22 shows one example of a LD current monitor group including the arithmetic circuit 60, the level convertor 61 and the reference current generator 24. In FIG. 22, the arithmetic circuit 60 and the level convertor 61 are the same as the arithmetic circuit 60 and the level convertor 61 explained in FIG. 21, and each of the arithmetic circuit 60 and the level convertor 61 also has the same feature in expanding a dynamic range of the LD current monitor.

A reference LD driver current $I_{fr}$ is outputted from the reference current generator 24. Accordingly, as the same as that in FIG. 21, a monitor LD driver current $I_{fm}$ obtained by branching the output from the pulse current driver 40 (refer to FIG. 15) for outputting the LD driver current $I_f$, which drives the laser diode LD, i.e., a current obtained by adding the threshold current Ith with the signal driver current $I_P$ and the reference LD driver current $I_{fr}$ outputted from the reference current generator 24 are inputted to the arithmetic circuit 60.

Therefore, according to a logic explained in FIG. 21, the LD driver current monitor voltage $V_{ML}$ outputted by converting the output signal level of the arithmetic circuit 60 with the use of the level convertor 61 becomes the normalized LD driver current $I_{fm}$.

Further, in FIG. 22, a reference current generator 24 for outputting the reference LD driver current $I_{fr}$ includes an Ith current generator 240, which generates a threshold current Ith, and a ($I_{fr}$–Ith) current generator 241 for outputting a different current ($I_{fr}$–Ith) between the reference LD driver current $I_{fr}$ and the threshold current Ith.

Furthermore, the ($I_{fr}$–Ith) current generator 241 employs the laser diode driver according to the present invention, as a commonly-used circuit, and generates a plurality of ($I_{fr}$–Ith) currents corresponding to temperature characteristics of the plurality of optical output powers, which may be selectively employed.

The output power switching control signal $V_S$ switches and selects one of the plurality of the ($I_{fr}$–Ith) currents, which are outputted from ($I_{fr}$–Ith) current generator 241, to correspond to the output power of the laser diode driver to be employed.

Additionally, the reference LD driver current $I_{fr}$ can be obtained by adding the threshold current Ith and the ($I_{fr}$–Ith) current. Further, the threshold current Ith is not subject to be switched according to an output power. This is because the threshold current Ith to be kept constant, even if the output power is changed.

Figure 23:
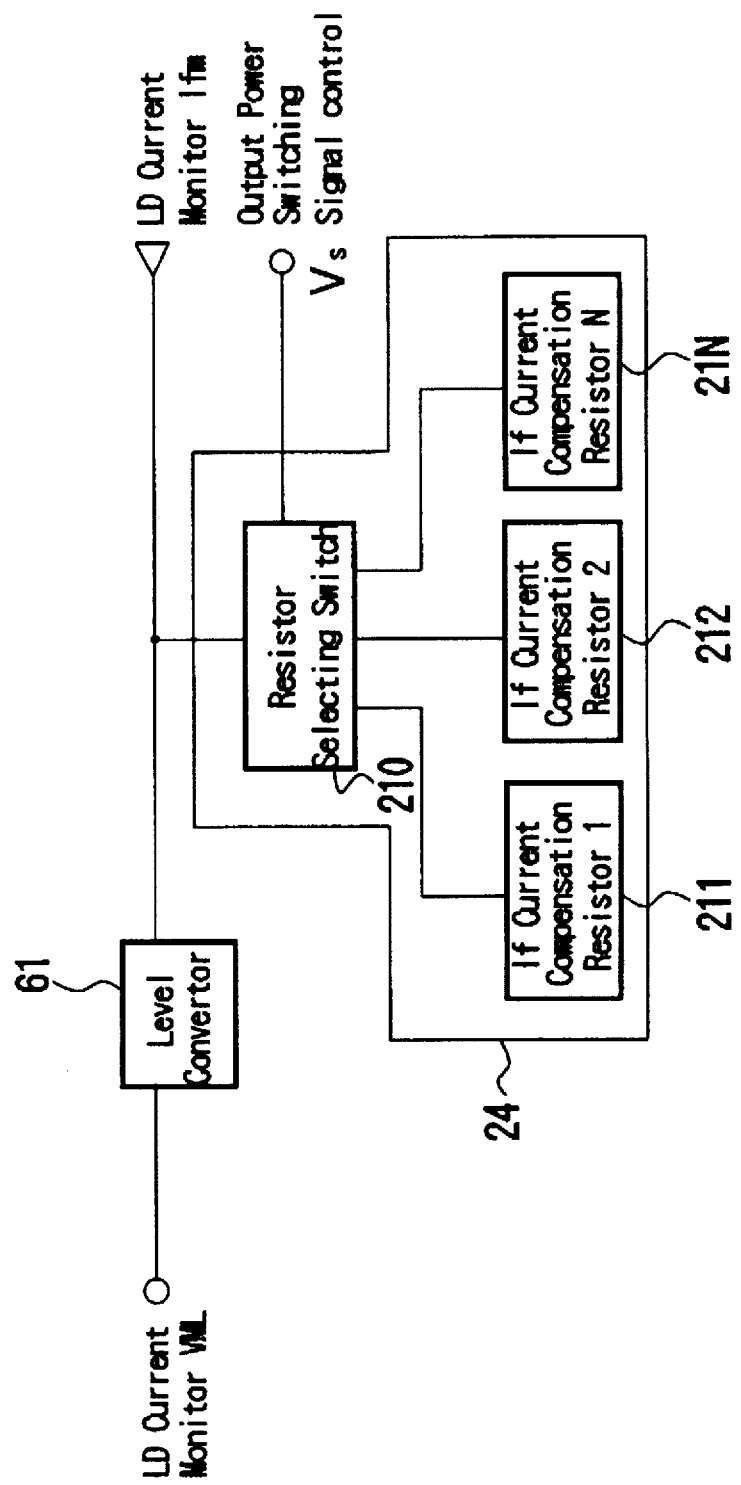
FIG. 23 shows a second embodiment of a PD current monitor group.

FIG. 23 shows a second example of the LD current monitor group. Similarly with the structure shown in FIG. 22, the structure shown in FIG. 23 cope with the object for expanding a dynamic range of the monitor current.

The reference current generator 24 provides a plurality of compensation resistors 211 to 21N for the plurality of the LD driver currents $I_f$ (=a threshold current Ith+a signal driver current $I_P$) corresponding to the N sorts of optical output powers. Each of the compensation resistors 211 to 21N has a characteristic reversed to the temperature characteristic of the LD driver current $I_f$ on the corresponding output power.

A selector 210 selects and switches one of the compensation resistors according to an optical power switching control signal $V_S$ to insert the selected one to the current path of LD monitor current $I_{fm}$ in parallel.

The selected and inserted compensation resistors include characteristics reversed to the temperature characteristics of the LD monitor current $I_{fm}$ of the corresponding output power. Therefore, it is possible to normalize the LD monitor current $I_{fm}$. Each of the compensation resistors may be formed of a thermistor or the like.

Figure 24:
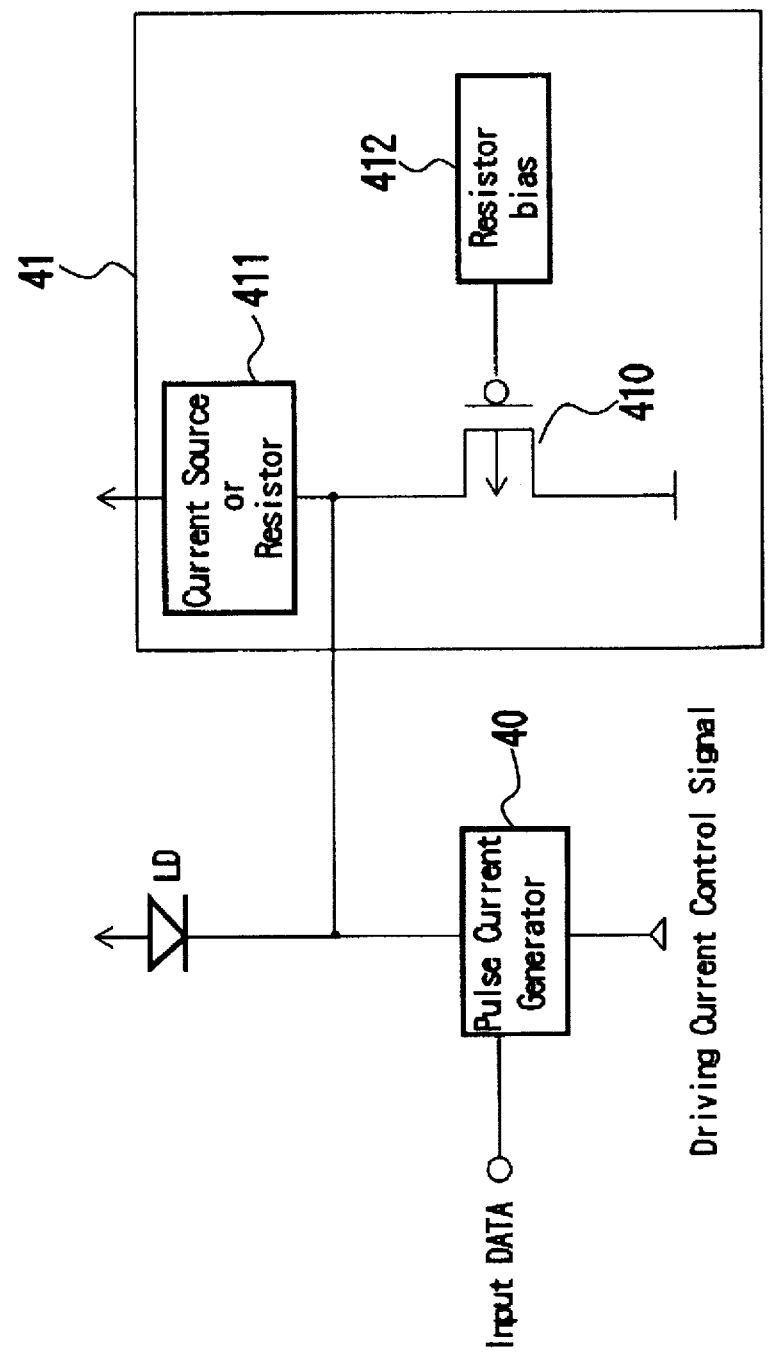
FIG. 24 shows a first embodiment of a second LD driver.

FIG. 24 shows a first example of the second LD driving circuit 41 shown in FIG. 1. As described above, as conventional problems explained on FIGS. 36 and 37, when a signal data includes consecutive zeros, the voltage of the LD can be decreased, and thus pattern jitters are generated due to the parasitic capacitance of the laser diode LD.

A second LD driver shown in FIG. 1 can solve the above-described problem. FIG. 24 shows only the relationship between the second and first LD drivers 40 and 41 shown in FIG. 1 and has a function of generating a pulse current, for simplicity.

The LD driver circuit 141 includes a Pch type FET group transistor 410, of which the gate terminal is supplied with a reference bias 412. The source terminal of the FET group transistor 410 is connected to the cathode of the laser diode LD and the current source 411.

Further, the reference bias 412 is set to a value for switching the FET group transistor 410 to ON, when the current flowing to the laser diode LD from the LD driver 41 is OFF. Accordingly, when the FET group transistor 410 is switched to ON, the accumulation charge of the laser diode LD is absorbed.

Therefore, the voltage $V_{LD}$ of the laser diode LD is fixed, and a problem in the conventional driver, such as a consecutive zero signal data generates a pattern jitter, may be solved.

Figure 25:
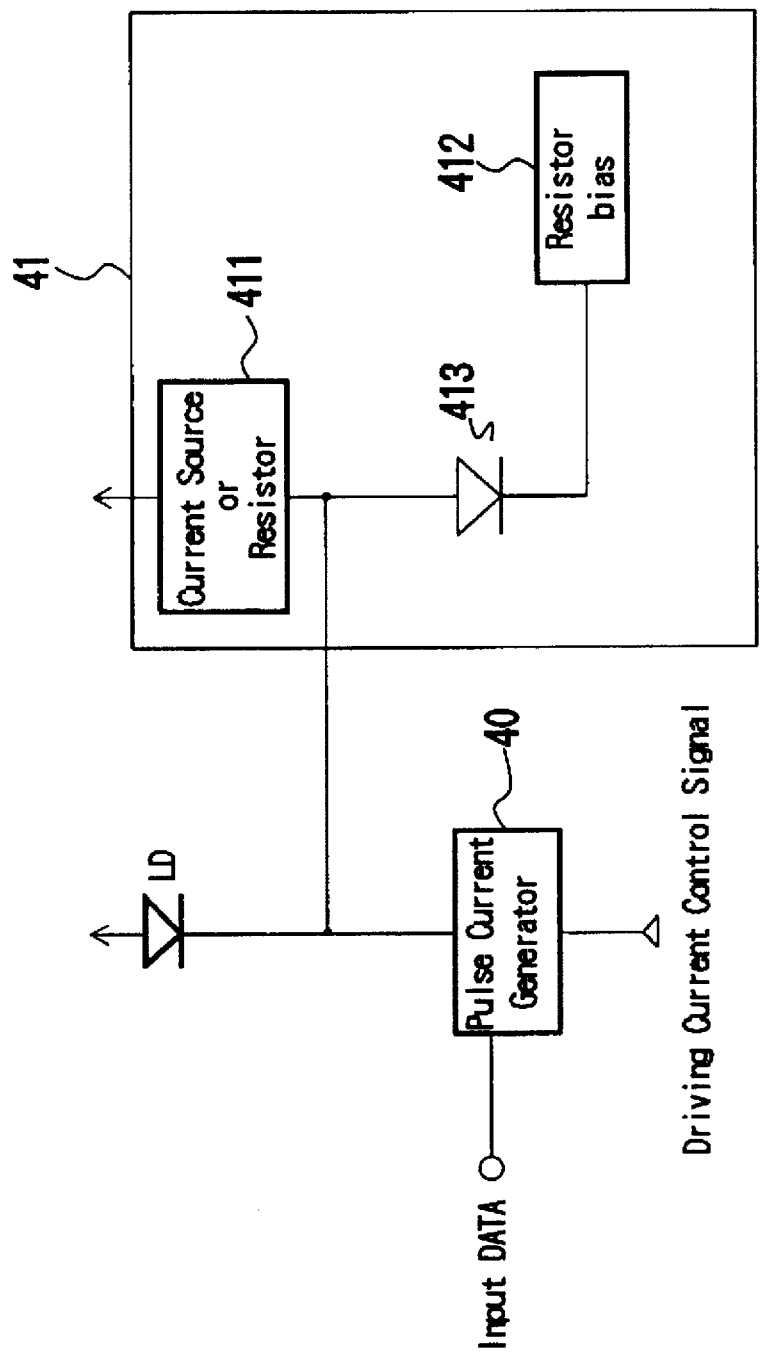
FIG. 25 shows a second embodiment of a second LD driver.

FIG. 25 shows a second example of the second LD driver 41 based on the object as the same as the example shown in FIG. 24. In this example, a diode 413 is employed instead of the FET group transistor 410 shown in FIG. 24. Considering that the voltage drop of the diode 413 is about 0.8 V, the reference bias 412 is set to a value for switching the diode 413 to ON, when the current flowing from the LD driver 4 to the laser diode LD is OFF. Accordingly, accumulated charge on the laser diode LD can be absorbed by switching the diode 413 to ON.

Figure 26:
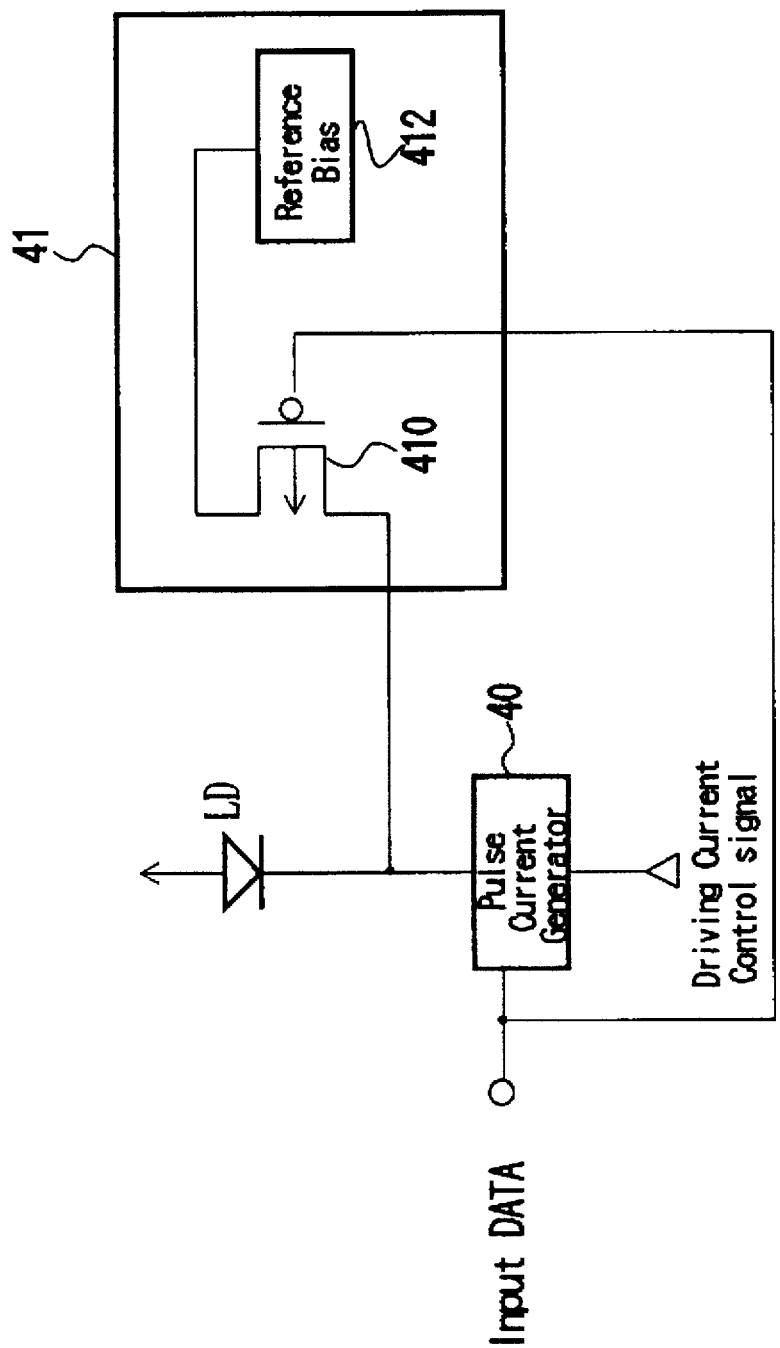
FIG. 26 shows a third embodiment of a second LD driver.

FIG. 26 shows a third mode of the second LD driver 41. In this example, the source-grounded FET group transistor 410 is employed to connect its drain to the cathode of the laser diode. When the current flowing from the LD driver 41 to the laser diode LD is OFF, the gate of the FET group transistor 410 is switched to ON with the input signal data. Therefore, the accumulated charge on the laser diode LD can be absorbed.

Figure 27:
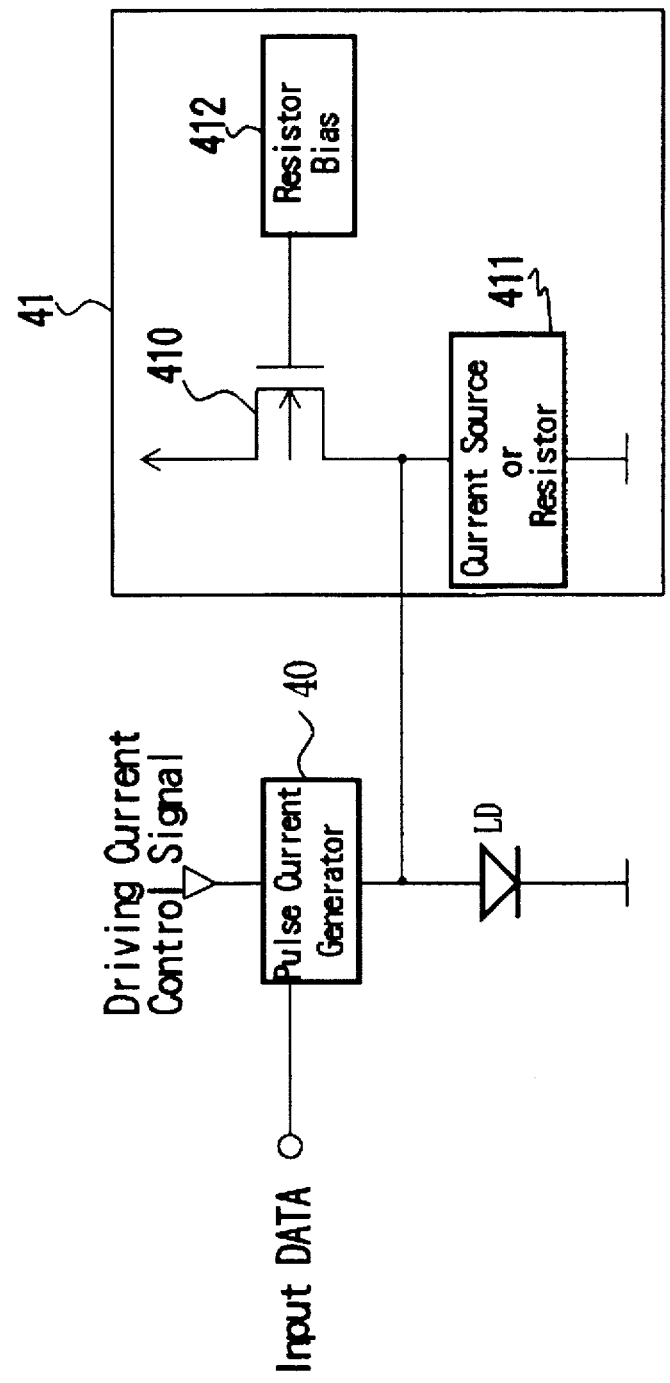
FIG. 27 shows a fourth embodiment of a second LD driver.
Figure 28:
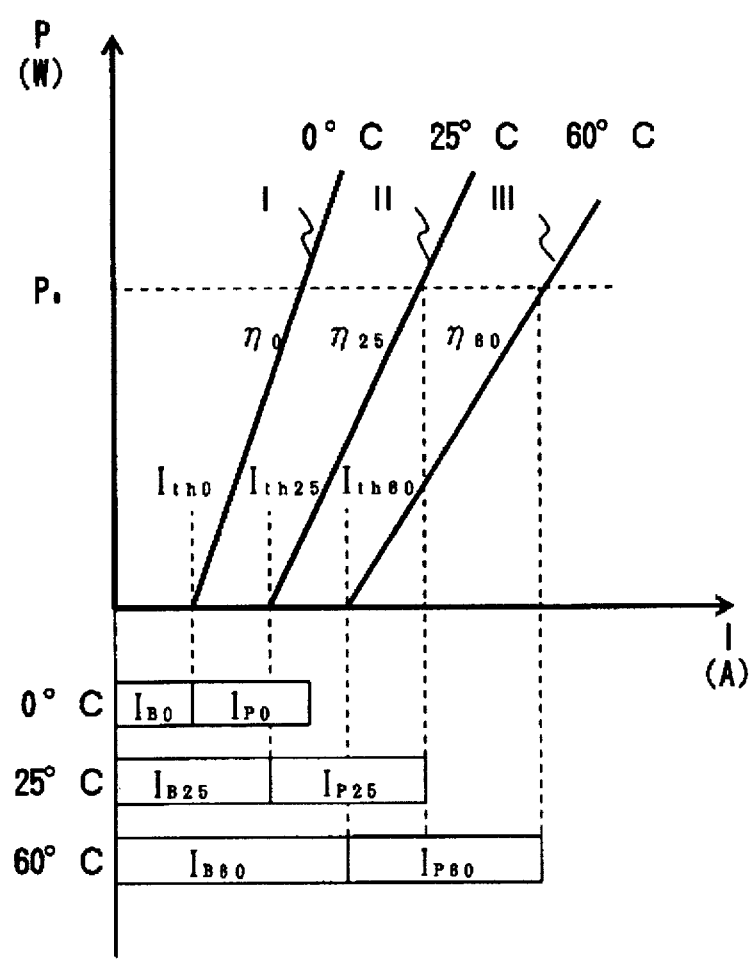
FIG. 28 explains fluctuation of an LD current control characteristic on each temperature.
Figure 29:
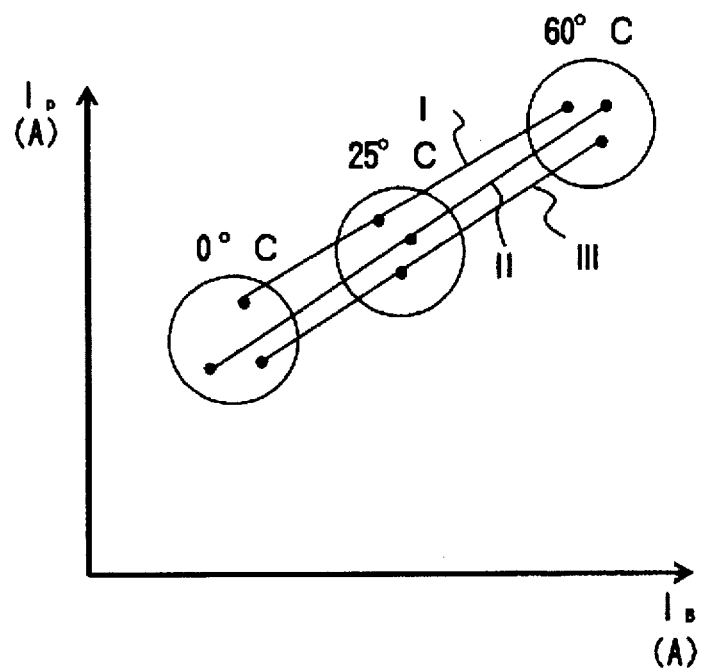
FIG. 29 explains each of IB-IP characteristics of a LD on each temperature.
Figure 30:
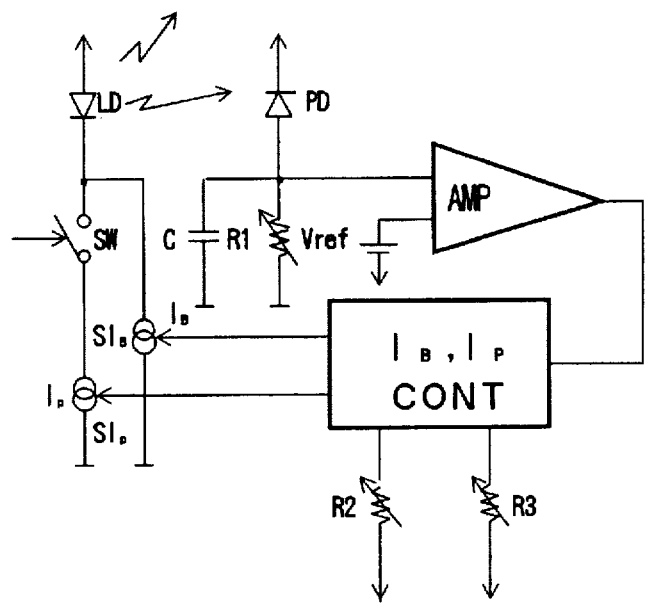
FIG. 30 shows an example of the conventional laser diode driver.
Figure 31:
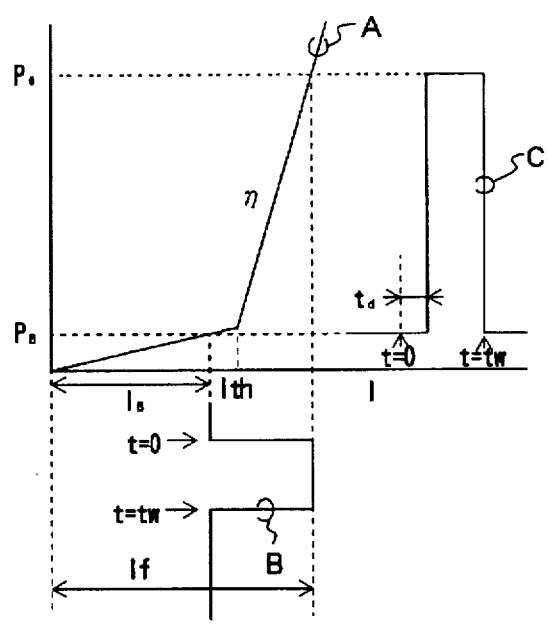
FIG. 31 explains variable parameters of a LD element.

Further, in the embodiments shown in FIGS. 24 to 26, polarity of each element may be reversed. FIG. 27 shows one example of reversing the polarity. The example is corresponding to the example shown in FIG. 24, and shows an example of employing N type polarity as a polarity of the FET group transistor 410. In this case, the LD driver 40 is connected to the anode side of the laser diode LD.

In the circuit having reversed polarity, when the current from the LD driver 41 is OFF, the accumulation charge of the laser diode LD can be absorbed through the FET group transistor 410, similarly.

As explained above, the present invention may improve reduction of adjusting means or resistors required in the conventional driver.

Additionally, when reducing the adjusting resistors, a peak value and an average value of the light-receipt signal of the monitor PD are detected, independent feed-back loops are employed for the peak value and the average value, respectively, and the duty and signal driving peak current $I_P$ are driven, in order to cope with a problem of the APC (Auto power control) group in the laser diode driver, i.e., the duty fluctuations.

The other problem of the monitor voltage fluctuations can be solved by switching the arithmetic circuit and the reference temperature characteristic to adjust the monitor output voltage.

The problem of the consecutive zero signal data can be further solved by fixing the laser diode voltage VLD, when the signal is zero.

The present invention may be embodied in other specific forms without departing from the spirit or essential characteristic thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A laser diode driver comprising:

a laser diode for emitting a light output corresponding to an input signal;

a light-receipt element for receiving a part of the light output emitted from the laser diode and outputting a light-receipt signal current corresponding to the received part of the light output;

a driver circuit operatively coupled to the laser diode for supplying a driving current, which drives the laser diode to emit the light output;

a detecting circuit operatively coupled to the light-receipt element for detecting peak and average values of the light-receipt signal current outputted from the light-receipt element; and a feed back loop for feeding back a control signal to stabilize a level and a duty of the driving current according to detected peak and average values of the light-receipt current.

2. A laser diode driver comprising:

a laser diode for emitting a light output corresponding to an input signal;

a light-receipt element for receiving a part of the light output emitted from the laser diode and outputting a light-receipt signal current corresponding to the received part of the light output;

a driver circuit operatively coupled to the laser diode for supplying a driving current, which drives the laser diode to emit the light output;

a duty variable controller for varying duty of a waveform of the driving current;

an optical output stabilization loop for detecting a peak value corresponding to the light-receipt current outputted from the light-receipt element, comparing the detected peak value with a first reference value, and controlling the driver circuit to output a size of the driving current according to the difference between the detected peak value and the first reference value; and a duty stabilization loop for detecting an average value corresponding to the light-receipt signal current outputted from the light-receipt element, comparing the detected average with a second reference value, and controlling the duty variable controller to output the duty of the waveform of the driving current according to the difference between the detected average value and the second reference value.

3. The laser diode driver according to claim 2, further comprising;

a current to voltage convertor for converting the light-receipt signal current to a corresponding voltage, a peak value and an average value of which are detected by the optical output stabilization loop and the duty stabilization loop, respectively; and a reference voltage generator for generating a reference voltage having an average value of the detected peak value and an average value.

4. The laser diode driver according to claim 2, further comprising;

a first current to voltage convertor for converting the light-receipt signal current to a corresponding voltage, a peak value and an average value of which are detected by the optical output stabilization loop and the duty stabilization loop, respectively;

a reference current generator for generating a reference current; and a second current to voltage convertor for converting the reference current to corresponding first and second reference voltages, which are respectively compared with the detected peak and average values of the corresponding voltage converted by the first current to voltage convertor.

5. The laser diode driver according to claim 4, wherein there is further comprised a conversion gain controller for controlling conversion gains of the first and second current to voltage convertors, and the conversion gain controller controls the gains of the first and second current to voltage convertors, based on the first reference voltage, which is compared with the detected peak of the corresponding voltage converted by the first current to voltage convertor.

6. The laser diode driver according to claim 2, further comprising:

a first current to voltage convertor for converting the light-receipt signal current to a corresponding voltage;

a peak value detecting circuit provided in the optical output stabilization loop for detecting a of the output voltage converted in the first current to voltage convertor;

an average value detecting circuit provided in the duty stabilization loop for detecting an average value of the output voltage converted in the fist current to voltage convertor;

a reference current generator for outputting a reference current;

a second current to voltage convertor for converting the reference current outputted from the reference current generator to reference voltages, which are compared with the detected peak and average values, respectively; and an output circuit for outputting the reference voltages output from the second current to voltage convertor through a second peak detector, which is equivalent to the peak value detector and the average value detector.

7. The laser diode driver according to claim 6, further comprising;

a conversion gain controller for controlling conversion gains in the first and second current to voltage convertors in order to control a size of conversion gain according to a reference voltage to be compared with the peak value selected from the output voltage converted in the second current/voltage convertor.

8. The laser diode driver according to claim 7, further comprising a current switch provided between the reference current generator and the second current to voltage convertor to convert the reference current outputted from the reference current generator an alternative current with a period of the input signal.

9. The laser diode driver according to claim 6, further comprising a current switch provided between the reference current generator and the second current to voltage convertor to convert the reference current outputted from the reference current generator an alternative current with a frequency period of the input signal.

10. The laser diode driver according to claim 8, further comprising an offset adjusting circuit for detecting an offset amount between the inputs of the first and second current to voltage convertors and controlling an output level of the first peak detector according to the detected offset amount.

11. The laser diode driver according to claim 10, further comprising first and second current amplifiers, each being provided on the input side of each of the first and second current to voltage converters for amplifying a current signal having a aide band width.

12. The laser diode driver according to claim 8, further comprising an offset adjusting circuit for detecting an offset amount between the inputs of the first and second current to voltage convertors and controlling an output level of the second peak detector according to the detected offset amount.

13. The laser diode driver according to claim 11, further comprising first and second current amplifiers, each being provided on the input side of each of the first and second current to voltage converters for amplifying a current signal having a aide band width.

14. The laser diode driver according to claim 2, further comprising:

a generator for generating a reference light-receipt signal current for the light-receipt element, corresponding to a predetermined output power of the laser diode; and an arithmetic circuit for receiving a light-receipt signal current outputted from the light-receipt element and the reference light-receipt signal current and converting the light-receipt signal current of the light-receipt element to a normalized monitor voltage, the arithmetic circuit including, a first current to voltage conversion circuit, a conversion gain of which is variably controlled, for converting the reference light-receipt signal current to a first corresponding voltage, a second current to voltage conversion circuit, a conversion gain of which is variably controlled, for converting the receipt-light signal current of the light-receipt element to a second corresponding voltage, a reference voltage generator for generating a reference voltage, and a comparison amplifier for outputting a difference signal between the reference voltage outputted from the reference voltage generator and the first corresponding voltage outputted from the first current to voltage conversion circuit, the difference signal being used for controlling the conversion gain of the second current to voltage conversion circuit.

15. The laser diode driver according to claim 2, further comprising:

a generator for generating a reference driving current for the laser diode, corresponding to a predetermined output power of the laser diode, including a first circuit for generating a threshold current, a second circuit for generating a differential current between a driving current corresponding to each optical output power and the threshold current, and a switch for selecting and outputting a differential current corresponding to the optical output power, outputted from the second circuit to composite the differential current selected and output from the switch and the threshold current output from the first circuit and to output a composite signal as the reference driving current; and an arithmetic circuit for receiving a driving current for the laser diode and the reference driving current, and converting the driving current for the laser diode to a normalized monitor voltage, including a first current to voltage convertor, a conversion gain of which is variable, for converting the reference driving current to a first corresponding voltage, a second current to voltage convertor, a conversion gain of which is variable, for converting the driving current for the laser diode to a second corresponding voltage, a reference voltage generator for generating a reference voltage, and a comparison amplifier for outputting a difference signal between the reference voltage output from the reference voltage generator and the first corresponding voltage output from the first current to voltage convertor to control the conversion gain of the second current to voltage convertor according to the difference signal output from the comparison amplifier.

16. The driver according to claim 2, further comprising a plurality of resistors, each having a characteristic reverse to a temperature characteristic of each driving current for the laser diode corresponding to each output power of the laser diode, and a circuit for supplying a driving current for a predetermined output power of the laser diode to a resistor selected from the plurality of resistors in accordance with the predetermined output power and outputting a monitor voltage corresponding to the driving current for the laser diode.

17. The laser diode driver according to claim 2, further comprising a circuit coupled to the laser diode for fixing a voltage applied to the laser diode, when a driving current from the driver circuit is not supplied.

18. The laser diode driver according to claim 2, further comprising a charge absorption circuit, of which one end is connected to a connecting point of the laser diode and the driver circuit for absorbing accumulated charges of the laser diode, when a driving current from the driver circuit to the laser diode is not supplied.

19. The laser diode driver according to claim 18,
wherein the charge absorption circuit includes a FET group transistor and a reference bias supplied to a gate of the FET group transistor, and a size of the reference bias is set so as to turn the FET group transistor ON state, when a driving current from the driving circuit to the laser diode is not supplied.

20. The laser diode driver according to claim 18,
wherein the charge absorption circuit includes a diode and a reference bias supplied to the diode, and a size of the reference bias is set so as to turn the diode ON state, when a driving current from the driver circuit to the laser diode is not supplied.

21. The laser diode driver according to claim 18,
wherein the charge absorption circuit includes a FET group transistor having the other end and a gate, to which the input signal is supplied, and a reference bias supplied to the other end of the FET group transistor, and a size of the reference bias is set so as to turn the FET group transistor ON state, when a driving current from the driver circuit to the laser diode is not supplied.

* * * * *